US009934960B2

(12) United States Patent
Horita et al.

(10) Patent No.: US 9,934,960 B2
(45) Date of Patent: Apr. 3, 2018

(54) METHOD OF MANUFACTURING SEMICONDUCTOR DEVICE

(71) Applicant: Hitachi Kokusai Electric Inc., Tokyo (JP)

(72) Inventors: Hideki Horita, Toyama (JP); Risa Yamakoshi, Toyama (JP); Masato Terasaki, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 15/059,591

(22) Filed: Mar. 3, 2016

(65) Prior Publication Data

US 2016/0284539 A1 Sep. 29, 2016

(30) Foreign Application Priority Data

Mar. 26, 2015 (JP) .................................. 2015-064639

(51) Int. Cl.
*H01L 21/02* (2006.01)
*C23C 16/40* (2006.01)
(Continued)

(52) U.S. Cl.
CPC ...... *H01L 21/02164* (2013.01); *C23C 16/401* (2013.01); *C23C 16/4408* (2013.01); *C23C 16/45502* (2013.01); *C23C 16/45527* (2013.01); *C23C 16/45561* (2013.01); *H01L 21/0228* (2013.01); *H01L 21/02211* (2013.01)

(58) Field of Classification Search
CPC ......... H01L 21/02163; H01L 21/02211; H01L 21/0228; H01L 16/45561; C23C 16/401; C23C 16/4408; C23C 16/45502; C23C 16/45527
See application file for complete search history.

(56) References Cited

U.S. PATENT DOCUMENTS 9,472,398 B2 * 10/2016 Saito ..................... C23C 16/34
9,496,134 B2 * 11/2016 Sasaki .................. C23C 16/403
(Continued)

FOREIGN PATENT DOCUMENTS

CN          1312757 C     4/2007
JP        2000-223432     8/2000
(Continued)

OTHER PUBLICATIONS

Office Action in corresponding Korean Application No. 10-2016-0010565, dated Mar. 2, 2017, with English translation.
(Continued)

*Primary Examiner* — Savitr Mulpuri
(74) *Attorney, Agent, or Firm* — Edell, Shapiro & Finnan, LLC

(57) ABSTRACT

A technique capable of suppressing the generation of foreign matter in a process container involves a method of manufacturing a semiconductor device including: (a) supplying a source gas to a substrate in a process container; (b) supplying an inert gas to an inner wall of an opening of the process container at a first flow rate while performing (a); (c) supplying a reactive gas to the substrate; and (d) supplying the inert gas to the inner wall at a second flow rate lower than the first flow rate while performing (c).

18 Claims, 16 Drawing Sheets

(51) Int. Cl.
    *C23C 16/44*     (2006.01)
    *C23C 16/455*    (2006.01)

(56) References Cited

U.S. PATENT DOCUMENTS

| | | | |
|---|---|---|---|
| 9,508,543 B2* | 11/2016 | Orihashi | H01L 21/02126 |
| 9,508,555 B2* | 11/2016 | Kaga | C23C 16/34 |
| 2003/0013320 A1* | 1/2003 | Kim | C23C 16/345 |
| | | | 438/778 |
| 2012/0100722 A1 | 4/2012 | Asai et al. | |
| 2013/0252439 A1* | 9/2013 | Hirose | C23C 16/30 |
| | | | 438/778 |
| 2014/0287594 A1* | 9/2014 | Terasaki | H01L 21/02164 |
| | | | 438/770 |
| 2015/0262816 A1* | 9/2015 | Saito | C23C 16/34 |
| | | | 438/761 |
| 2015/0303054 A1* | 10/2015 | Hanashima | H01L 21/02164 |
| | | | 438/758 |

FOREIGN PATENT DOCUMENTS

| | | |
|---|---|---|
| JP | 2010-141076 A | 6/2010 |
| KR | 10-2013-0107232 A | 10/2013 |

OTHER PUBLICATIONS

Office Action in corresponding Taiwan Application No. 105100931, dated Mar. 27, 2017, with English translation.

\* cited by examiner

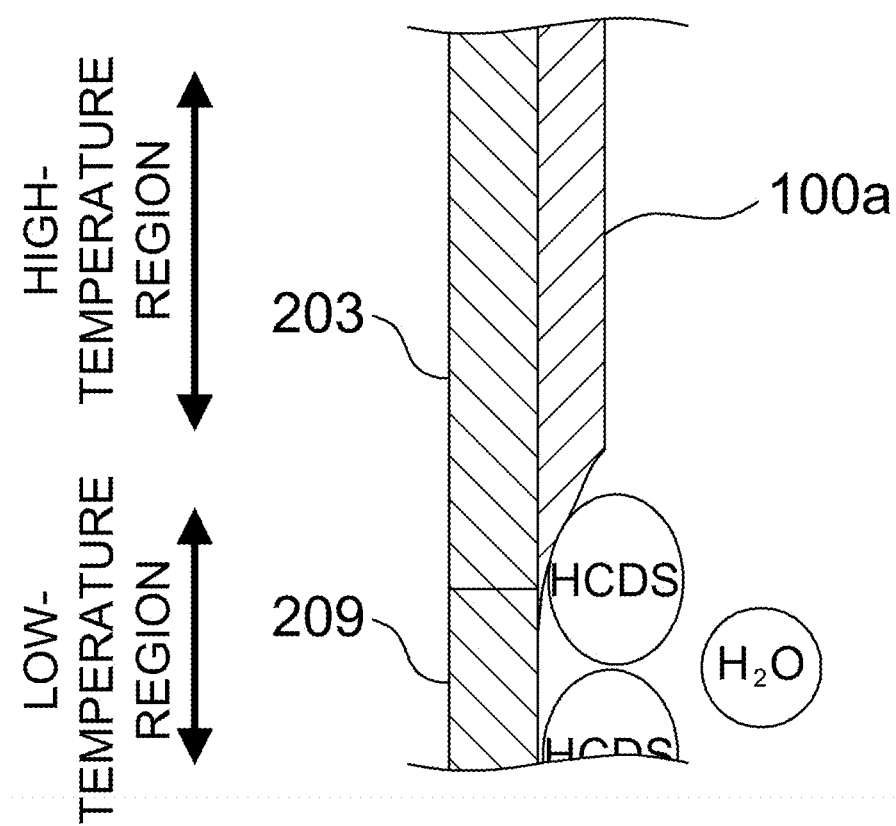

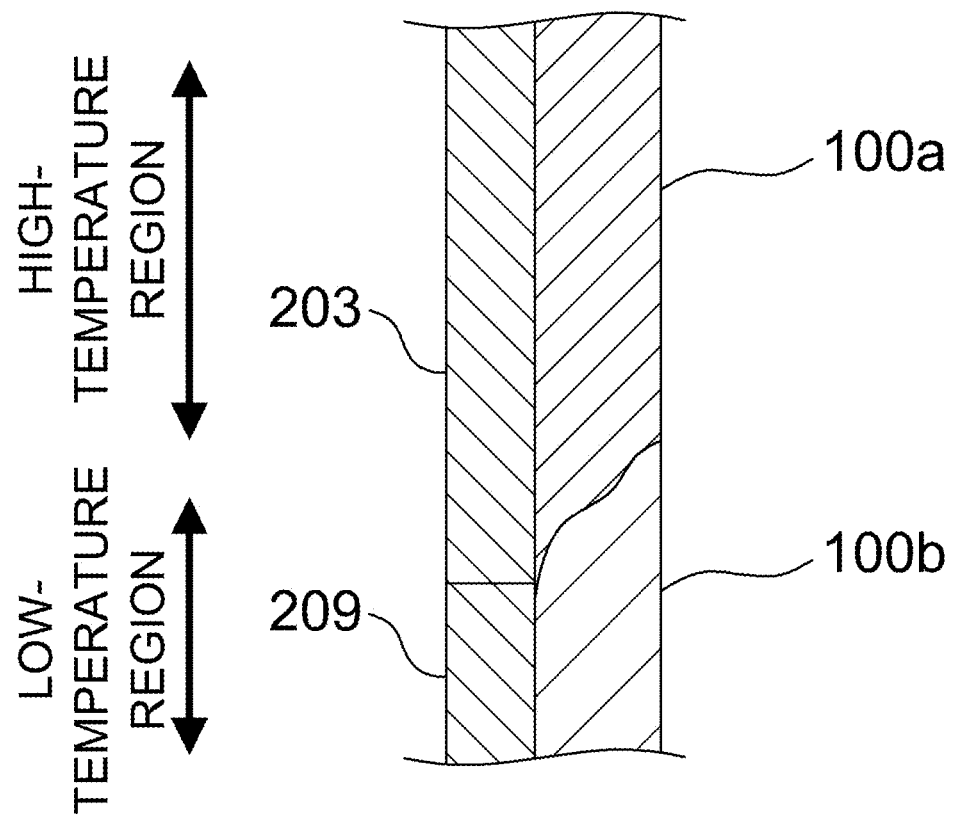

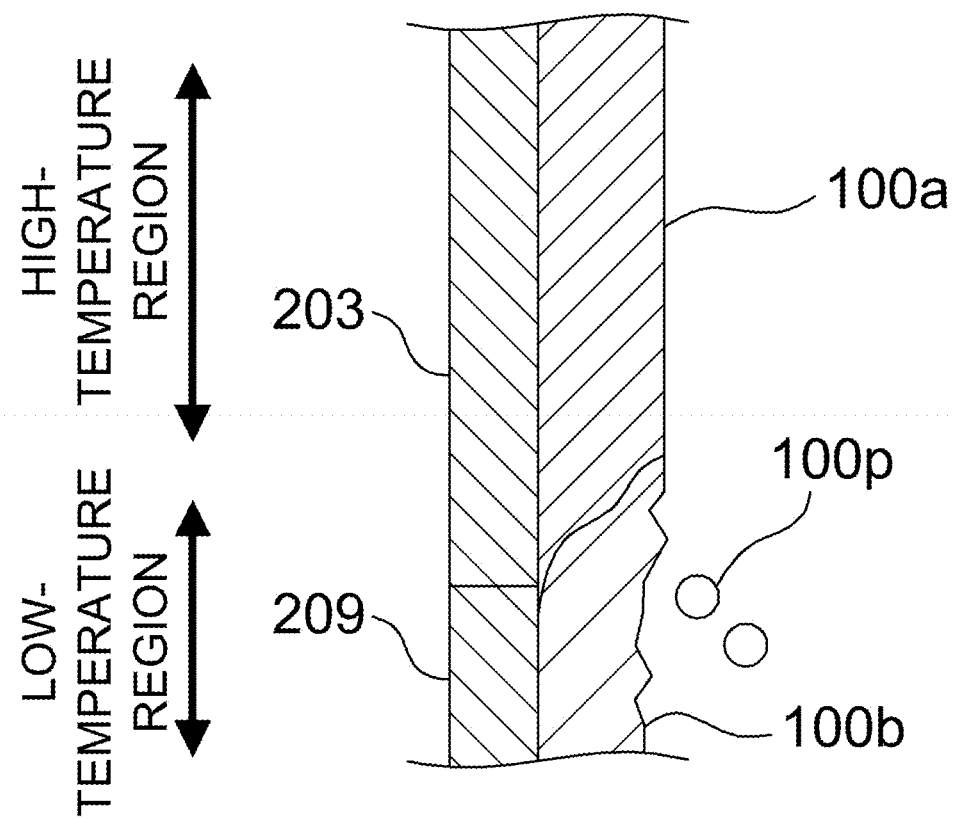

METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2015-064639 filed on Mar. 26, 2015, the entire contents of which are hereby incorporated by reference.

FIELD OF THE INVENTION

The present invention relates to a method of manufacturing a semiconductor device.

BACKGROUND

As a method of manufacturing a semiconductor device, a process in which a film is formed on a substrate is performed by supplying a source gas or a reaction gas onto a substrate accommodated in a process container. In this case, foreign matter (particles) is generated due to reaction by-products attached onto the process container, and thus the quality of the film forming process can be reduced.

SUMMARY

The present invention provides a technique capable of suppressing the generation of foreign matter in a process container.

According to an aspect of the present invention, there is provided a technique including: (a) supplying a source gas to a substrate in a process container; (b) supplying an inert gas to an inner wall of an opening of the process container at a first flow rate while performing the step (a); (c) supplying a reactive gas to the substrate; and (d) supplying the inert gas to the inner wall at a second flow rate lower than the first flow rate while performing the step (c).

BRIEF DESCRIPTION OF THE DRAWINGS

FIG. 9D is a diagram illustrating a state in which moisture in the air is supplied onto the adsorption layer of the source formed in the low-temperature region in the process container, FIG. 9E is a diagram illustrating a state in which a deposition film made by depositing reaction by-products is formed in the low-temperature region in the process container, and FIG. 9F is a diagram illustrating a state in which foreign matter is generated from the deposition film.

DETAILED DESCRIPTION

An Embodiment of the Present Invention

Hereinafter, an embodiment of the present invention will be described with reference to FIGS. 1 through 3.

(1) Configuration of Substrate Processing Apparatus

Figure 1:
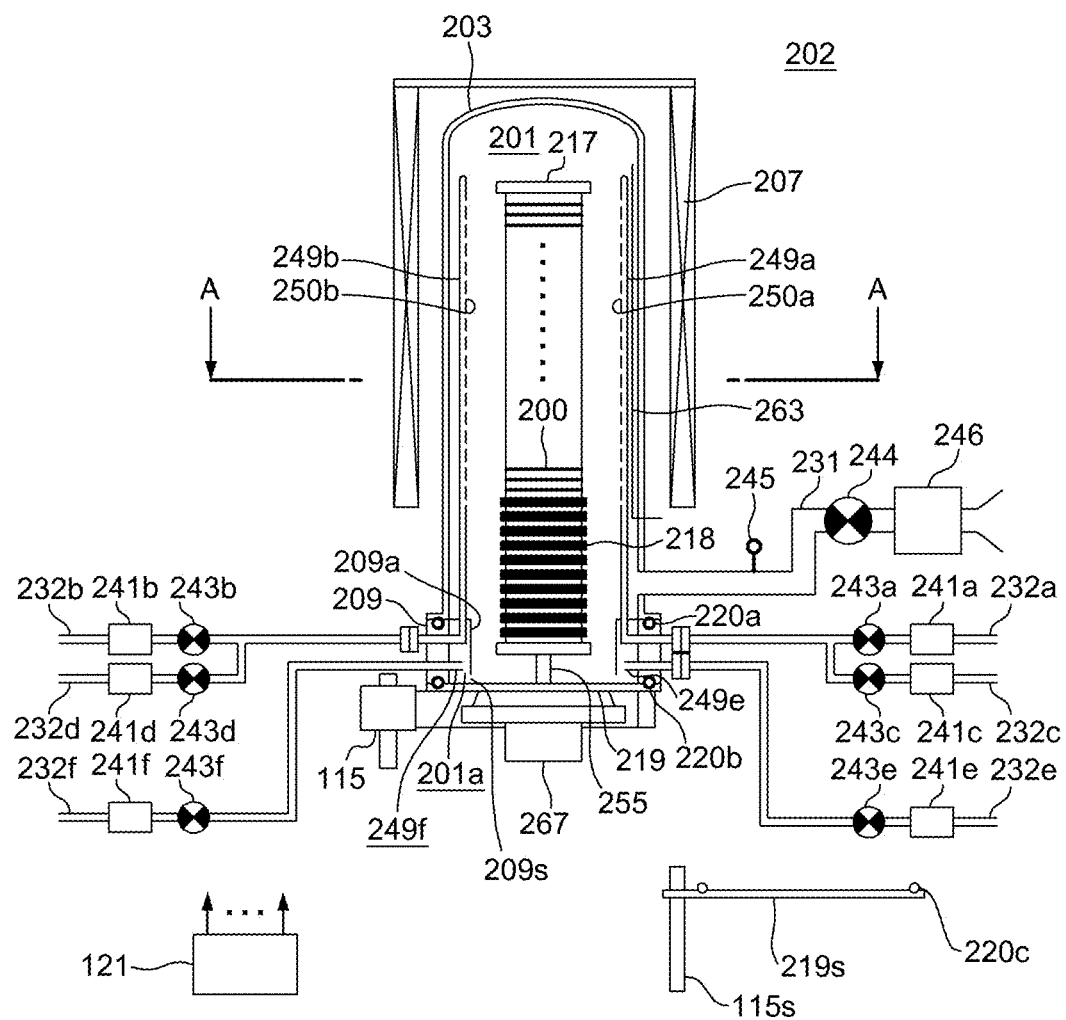
FIG. 1 is a schematic configuration diagram illustrating a vertical processing furnace of a substrate processing apparatus preferably used in an embodiment of the present invention and is a longitudinal sectional view illustrating the processing furnace.
Figure 2:
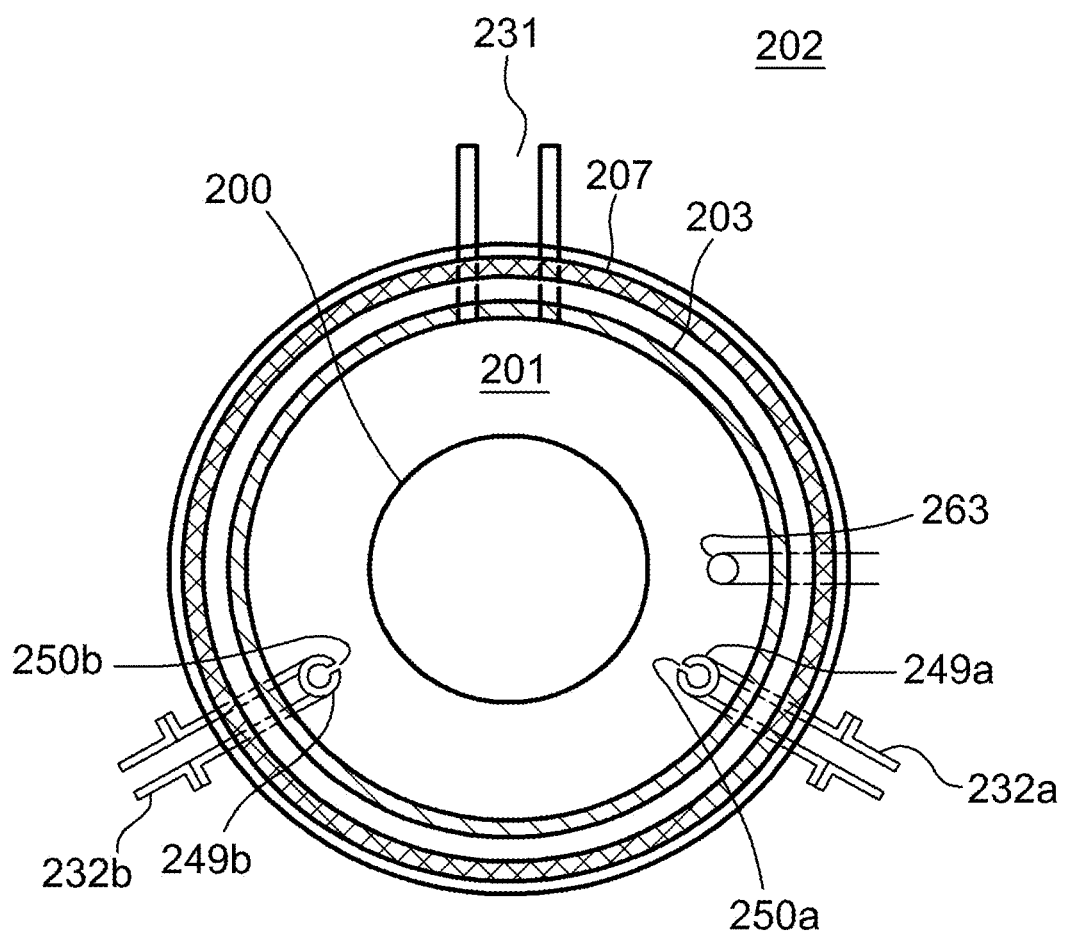
FIG. 2 is a schematic configuration diagram illustrating a vertical processing furnace of the substrate processing apparatus preferably used in the embodiment of the present invention and is a cross-sectional view illustrating the processing furnace taken along line A-A of FIG. 1.

As illustrated in FIG. 1, a processing furnace 202 includes a heater 207 serving as a heating unit (heating mechanism). The heater 207 has a cylindrical shape and is vertically installed by being supported by a heater base (not illustrated) serving as a holding plate. The heater 207 serves as an activating mechanism (excitation unit) for activating (exciting) a gas by heat as described below.

In the heater 207, a reaction tube 203 is concentrically installed with respect to the heater 207. The reaction tube 203 is made of a heat-resistant material such as quartz ($SiO_2$), silicon carbide (SiC) or the like, and is formed to have a cylindrical shape whose upper end is closed and a lower end is open. A manifold 209 (inlet flange) is concentrically installed with respect to the reaction tube 203 below the reaction tube 203. The manifold 209 is made of a metal such as stainless (SUS) or the like, and is formed to have a cylindrical shape whose upper and lower ends are open. The manifold 209, whose upper end is connected to a lower end of the reaction tube 203, is configured to support the reaction tube 203. An O-ring 220a serving as a sealing member is installed between the manifold 209 and the reaction tube 203. The manifold 209 is supported by the heater base, and thereby the reaction tube 203 is in a vertically installed state. A process container (reaction container) mainly includes the reaction tube 203 and the manifold 209. A process chamber 201 is provided in a cylindrical hollow portion of the process container. The process chamber 201 is configured to accommodate a plurality of wafers 200 serving as substrates by a boat 217 to be described below in a state of being vertically arranged on multiple stages in a horizontal posture.

A nozzle 249a serving as a first nozzle, a nozzle 249b serving as a second nozzle and nozzles 249e and 249f serving as furnace port nozzles are installed in the process chamber 201 to pass through the manifold 209. Each of the nozzles 249a, 249b, 249e and 249f is made of a heat-resistant material such as quartz, silicon carbide (SiC) or the like. Gas supply pipes 232a, 232b, 232e and 232f are connected to the nozzles 249a, 249b, 249e and 249f, respectively. Thus, the four nozzles 249a, 249b, 249e and 249f and the four gas supply pipes 232a, 232b, 232e and 232f are installed in the process container. A plurality of types of gases are supplied into the process chamber 201.

Mass flow controllers (MFCs) 241a, 241b, 241e and 241f serving as flow rate controllers (flow rate control units) and valves 243a, 243b, 243e and 243f serving as opening and closing valves are sequentially installed from an upstream end in the gas supply pipes 232a, 232b, 232e and 232f, respectively. Gas supply pipes 232c and 232d configured to supply an inert gas are connected to downstream sides of the valves 243a and 243b of the gas supply pipes 232a and 232b, respectively. MFCs 241c and 241d serving as flow rate controllers and valves 243c and 243d serving as opening and closing valves are sequentially installed from an upstream end in the gas supply pipes 232c and 232d, respectively.

The nozzles 249a and 249b are connected to front ends of the gas supply pipes 232a and 232b, respectively. As illustrated in FIG. 2, the nozzles 249a and 249b are installed in a ring-shaped space formed between an inner wall of the reaction tube 203 and the wafer 200, from a lower inner wall to an upper inner wall of the reaction tube 203, so as to rise in a direction in which the wafers 200 are stacked. That is, the nozzles 249a and 249b are respectively installed along a wafer arrangement region in which the wafers 200 are arranged, in regions that horizontally surround the wafer arrangement region at sides of the wafer arrangement region. That is, the nozzles 249a and 249b are vertically installed with respect to a surface (flat surface) of the wafer 200 at sides of ends (peripheral portions) of the wafers 200 loaded in the process chamber 201. Each of the nozzles 249a and 249b is configured as an L-shaped long nozzle, and includes a horizontal portion installed to pass through a side wall of the manifold 209 and a vertical portion installed to rise at least from one end side of the wafer arrangement region toward the other end side thereof. Gas supply holes 250a and 250b configured to supply a gas are installed at side surfaces of the nozzles 249a and 249b, respectively. The gas supply holes 250a and 250b may be open toward the center of the reaction tube 203 to supply a gas to the wafer 200. A plurality of gas supply holes 250a and 250b are installed from a lower portion of the reaction tube 203 to an upper portion thereof, and are installed to respectively have the same opening area at the same opening pitch.

Thus, in the present embodiment, a gas is transferred through the nozzles 249a and 249b that are disposed in a longitudinally extending space having a ring shape defined by an inner sidewall of the reaction tube 203 and ends (peripheral portions) of the plurality of wafers 200 arranged in the reaction tube 203 in a plan view, that is, in a cylindrical-shaped space. Also, the gas is initially sprayed into the reaction tube 203 in the vicinity of the wafer 200 through the gas supply holes 250a and 250b that are open at the nozzles 249a and 249b, respectively. Also, a main flow of the gas in the reaction tube 203 is set as a direction parallel to a surface of the wafer 200, that is, a horizontal direction. With such a configuration, it is possible to uniformly supply the gas to each of the wafers 200, thereby increasing film thickness uniformity of a thin film formed on each of the wafers 200. The gas flowing along the surface of the wafer 200, that is, a residual gas after a reaction, flows toward an exhaust port, that is, toward an exhaust pipe 231 to be described below. However, a flow direction of the residual gas is not limited to the vertical direction, but may be appropriately defined according to a position of the exhaust port.

The nozzles 249e and 249f are connected to front ends of the gas supply pipes 232e and 232f, respectively. The nozzles 249e and 249f are installed at regular intervals in an inner circumference direction of the manifold 209. As illustrated in FIG. 1, the nozzles 249e and 249f are configured such that a gas is sprayed into a ring-shaped space provided in a gap between an inner wall of the manifold 209 and a cover 209a to be described below in a plan view, that is, into a cylindrical-shaped space 201a (hereinafter, referred to as a purge space), that is, to the inner wall of the manifold 209. Gas supply holes are installed at front ends of the nozzles 249e and 249f. The gas supply holes may be installed at side surfaces of the nozzles 249e and 249f.

As a source gas containing a predetermined element, for example, a halosilane source gas containing silicon (Si) serving as the predetermined element and a halogen element is supplied into the process chamber 201 through the gas supply pipe 232a via the MFC 241a, the valve 243a and the nozzle 249a.

The halosilane source gas refers to a halosilane source in a gaseous state, for example, a gas that is obtained by vaporizing a halosilane source in a liquid state under room temperature and normal pressure or a halosilane source in a gaseous state under room temperature and normal pressure. The halosilane source is a silane source containing a halogen group. The halogen group includes a chloro group, a fluoro group, a bromo group, an iodo group and the like. That is, the halogen group includes a halogen element such as chlorine (Cl), fluorine (F), bromine (Br), iodine (I) or the like. The halosilane source may be a type of halide. When the term "source" is used in this specification, it may refer to one or both of "a liquid source in a liquid state" or "a source gas in a gaseous state."

As the halosilane source gas, for example, a source gas containing silicon (Si) and chlorine (Cl), that is, a chlorosilane source gas may be used. As the chlorosilane source gas, for example, a hexachlorodisilane ($Si_2Cl_6$, abbreviated as HCDS) gas may be used. When a liquid source in a liquid state under room temperature and normal pressure such as HCDS is used, the liquid source is vaporized by a vaporization system such as a vaporizer or a bubbler, and then is supplied as a source gas (such as HCDS gas).

As a reaction gas having a different chemical structure (molecular structure) from the source gas, for example, an oxygen-containing gas is supplied into the process chamber 201 through the gas supply pipe 232b via the MFC 241b, the valve 243b and the nozzle 249b. The oxygen-containing gas serves as an oxidizing gas, that is, an oxygen source in a film forming process to be described below. As the oxygen-containing gas, for example, oxygen ($O_2$) gas may be used.

As a reaction gas having a different chemical structure from the source gas, for example, a hydrogen-containing gas is supplied into the process chamber 201 through the gas supply pipe 232a via the MFC 241a, the valve 243a and the nozzle 249a. Although oxidizing effects may not be obtained as the hydrogen-containing gas by itself, an oxidizing species such as atomic oxygen (O) is generated by a reaction with the oxygen-containing gas under a predetermined condition in the film forming process to be described below and serves to improve the efficiency of the oxidation process. This is why the hydrogen-containing gas may be considered to be included in the oxidizing gas similar to the oxygen-containing gas. As the hydrogen-containing gas, for example, hydrogen (H$_2$) gas may be used.

As an inert gas, for example, nitrogen (N$_2$) gas is supplied into the process chamber 201 through the gas supply pipes 232c and 232d via the MFC 241c and 241d, the valves 243c and 243d, the gas supply pipes 232a and 232b and the nozzles 249a and 249b, respectively.

As an inert gas, for example, nitrogen (N$_2$) gas is supplied into a purge space 201a more inside than the cover 209a to be described below through the gas supply pipes 232e and 232f via the MFCs 241e and 241f, the valves 243e and 243f, the nozzles 249e and 249f, respectively.

When a source gas is supplied through the gas supply pipe 232a, a source gas supply system mainly includes the gas supply pipe 232a, the MFC 241a and the valve 243a. The nozzle 249a may be included in the source gas supply system. The source gas supply system may be referred to as a source supply system. When a halosilane source gas is supplied through the gas supply pipe 232a, the source gas supply system may be referred to as a halosilane source gas supply system or a halosilane source supply system.

When an oxygen-containing gas is supplied through the gas supply pipe 232b, an oxygen-containing gas supply system mainly includes the gas supply pipe 232b, the MFC 241b and the valve 243b. The nozzle 249b may be included in the oxygen-containing gas supply system. The oxygen-containing gas supply system may be referred to as an oxidizing gas supply system or an oxidant supply system.

When a hydrogen-containing gas is supplied through the gas supply pipe 232a, a hydrogen-containing gas supply system mainly includes the gas supply pipe 232a, the MFC 241a and the valve 243a. The nozzle 249a may be included in the hydrogen-containing gas supply system. The hydrogen-containing gas supply system may be included in the above-described oxidizing gas supply system (oxidant supply system).

Any or all of the above-described source gas supply system, oxygen-containing gas supply system and hydrogen-containing gas supply system may be referred to as a film-forming gas supply system. Also, one or both of the oxygen-containing gas supply system and the hydrogen-containing gas supply system may be referred to as a reaction gas supply system.

Also, an inert gas supply system mainly includes the gas supply pipes 232c through 232f, the MFCs 241c through 241f and the valves 243c through 243f The nozzles 249a, 249b, 249e and 249f may be included in the inert gas supply system downstream from a portion of the gas supply pipe 232a connecting to the gas supply pipe 232c, downstream from a portion of the gas supply pipe 232b connecting to the gas supply pipe 232d. The inert gas supply system may be referred to as a purge gas supply system, a dilution gas supply system or a carrier gas supply system. Also, the gas supply system including the gas supply pipes 232e and 232f, the MFCs 241e and 241f and the valves 243e and 243f may be referred to as an opening purge gas supply system, a barrier gas supply system or a diffusion barrier gas supply system. The cover 209a may be included in the opening purge gas supply system.

The exhaust pipe 231 configured to exhaust an atmosphere in the process chamber 201 is installed in the reaction tube 203. A vacuum pump 246 serving as a vacuum exhaust device is connected to the exhaust pipe 231 through a pressure sensor 245 serving as a pressure detector (pressure detecting unit) configured to detect a inner pressure of the process chamber 201 and an auto pressure controller (APC) valve 244 serving as an exhaust valve (pressure regulating unit). The APC valve 244 is a valve that may perform vacuum-exhaust start and vacuum-exhaust stop in the process chamber 201 by opening or closing the valve while the vacuum pump 246 operates, and regulate a inner pressure of the process chamber 201 by adjusting a degree of valve opening based on information on pressure detected by the pressure sensor 245 while the vacuum pump 246 operates. An exhaust system mainly includes the exhaust pipe 231, the APC valve 244 and the pressure sensor 245. The vacuum pump 246 may be included in the exhaust system. The exhaust pipe 231 is not limited to the installation in the reaction tube 203, but may be installed in the manifold 209 similar to the nozzles 249a, 249b, 249e and 249f.

A seal cap 219 serving as a furnace port cover capable of air-tightly sealing a lower opening of the manifold 209 is installed below the manifold 209. The seal cap 219 is configured to abut a lower end of the manifold 209 in a vertical direction from a lower portion thereof. The seal cap 219 is made of a metal such as SUS or the like, and has a disk shape. An O-ring 220b is installed on an upper surface of the seal cap 219 as a sealing member that abuts the lower end of the manifold 209. A rotating mechanism 267 configured to rotate the boat 217 to be described below is installed at a side opposite to the seal cap 219 of the process chamber 201. A rotary shaft 255 of the rotating mechanism 267 passes through the seal cap 219 to be connected to the boat 217. The rotating mechanism 267 is configured to rotate the wafer 200 by rotating the boat 217. The seal cap 219 is configured to be vertically moved upward and downward by a boat elevator 115 serving as a lifting mechanism that is vertically installed outside of the reaction tube 203. The boat elevator 115 is configured to load and unload the boat 217 into and from the process chamber 201 by moving the seal cap 219 upward and downward. That is, the boat elevator 115 is configured as a transfer device (transfer mechanism) that transfers the boat 217 and the wafer 200 supported by the boat 217 into or out of the process chamber 201. A shutter 219s serving as a furnace port cover capable of air-tightly sealing the lower opening of the manifold 209 while the seal cap 219 is lowered by the boat elevator 115 is installed below the manifold 209. The shutter 219s is made of a metal such as SUS or the like, and has a disk shape. An O-ring 220c is installed on an upper surface of the shutter 219s as a sealing member that abuts the lower end of the manifold 209. An opening or closing operation (a lifting and lowering operation, a rotational operation or the like) of the shutter 219s is controlled by a shutter opening and closing mechanism 115s.

The boat 217 serving as a substrate support is configured to support the plurality of wafers 200, for example, 25 to 200 wafers 200, that are vertically arranged in a horizontal orientation while centers thereof are aligned, that is, to support the wafers arranged at intervals. The boat 217 is made of a heat-resistant material such as quartz, silicon carbide (SiC) or the like. Below the boat 217, an insulating plate 218 made of a heat-resistant material such as quartz, silicon carbide (SiC) or the like is supported in a horizontal orientation on multiple stages. According to such a configuration, heat from the heater 207 is not easily transferred to the seal cap 219 side. However, the present embodiment is not limited to the above-described form. For example, no insulating plate 218 may be installed below the boat 217, and an insulation tube configured as a tubular member made of a heat-resistant material such as quartz, silicon carbide (SiC) or the like may be installed.

The cover 209a is installed at an inner circumference of the manifold 209. The cover 209a is made of a heat-resistant material such as quartz, silicon carbide (SiC) or the like and is installed to cover an inner wall of the manifold 209 along the inner wall of the manifold 209. As described above, the purge space 201a having a cylindrical shape is provided in a gap between the cover 209a and the manifold 209. In a state in which the lower opening of the manifold 209 is sealed by the seal cap 219, a gap [a gas distribution slit 209s] having a predetermined width is provided between the seal cap 219 and the cover 209a. The gas distribution slit 209s has a ring shape along a peripheral direction of the cover 209a. The cover 209a is not installed at the inner circumference of the manifold 209, but may be installed below the inner wall of the reaction tube 203 or on the upper surface of the seal cap 219.

The gas distribution slit 209s is configured to distribute a gas between the process chamber 201 and the purge space 201a. For example, the gas distribution slit 209s serves to spray the inert gas supplied into the process chamber 201 from the inside of the purge space 201a through the nozzles 249e and 249f in Step 1 of the film forming process to be described below. Also, for example, the gas distribution slit 209s serves to introduce the reaction gas supplied into the process chamber 201 into the purge space 201a as well as the process chamber 201 in Step 2 of the film forming process to be described below.

A temperature sensor 263 serving as a temperature detector is installed in the reaction tube 203. By adjusting power supply to the heater 207 based on information on the temperature detected by the temperature sensor 263, the temperature in the process chamber 201 is set to have a desired temperature distribution. Similar to the nozzles 249a and 249b, the temperature sensor 263 is configured in an L shape, and is installed along the inner wall of the reaction tube 203.

Figure 3:
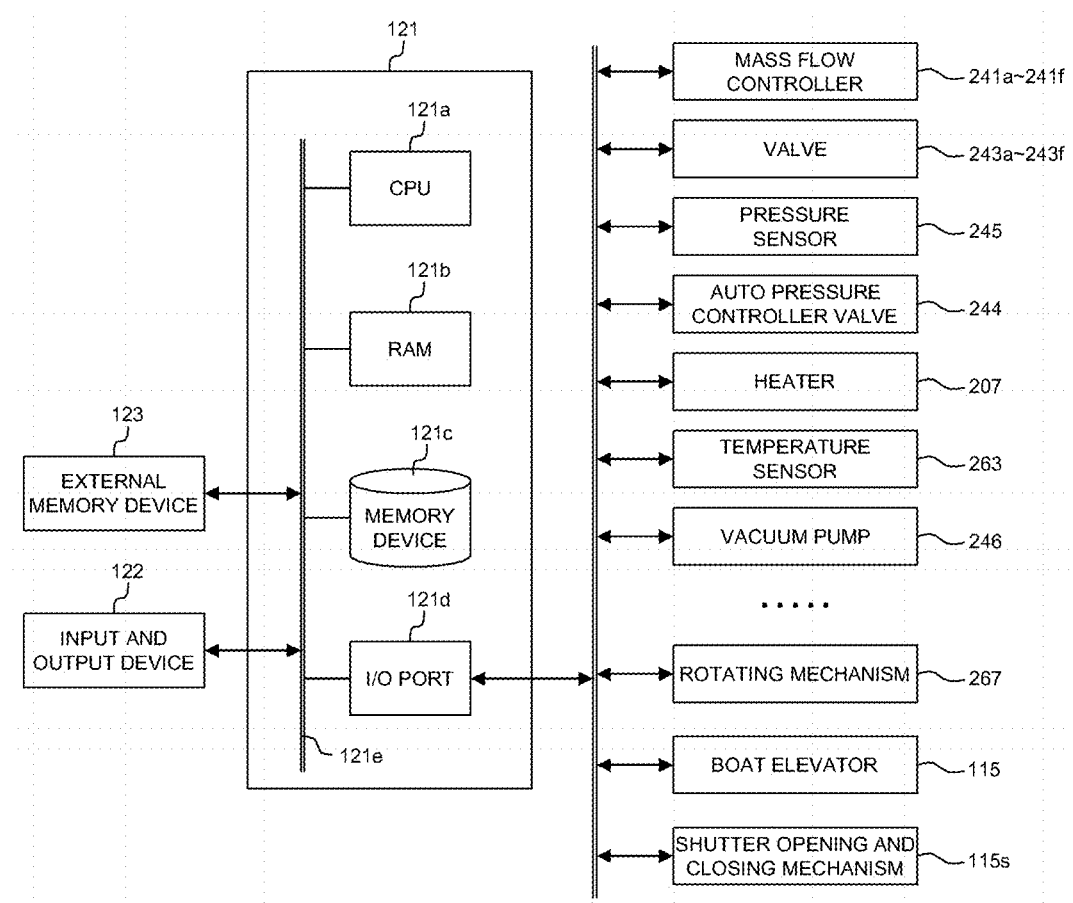
FIG. 3 is a schematic configuration diagram illustrating a controller of the substrate processing apparatus preferably used in the embodiment of the present invention and is a block diagram illustrating a control system of the controller.

As illustrated in FIG. 3, a controller 121 serving as a control unit (control device) is configured as a computer that includes a central processing unit (CPU) 121a, a random access memory (RAM) 121b, a memory device 121c and an input-and-output (I/O) port 121d. The RAM 121b, the memory device 121c and the I/O port 121d are configured to exchange data with the CPU 121a through an internal bus 121e. An I/O device 122 configured as, for example, a touch panel, is connected to the controller 121.

The memory device 121c is configured as, for example, a flash memory, a hard disk drive (HDD) or the like. A control program for controlling operations of the substrate processing apparatus, a process recipe describing sequences or conditions of substrate processing (to be described below) and the like are readably stored in the memory device 121c. The process recipe, which is a combination of sequences, causes the controller 121 to execute each sequence in the film forming process to be described below in order to obtain a predetermined result, serves as a program. Hereinafter, such a process recipe, a control program and the like are collectively simply called a "program." Also, the process recipe is simply called a "recipe." When the term "program" is used in this specification, it may refer to one or both of the process recipe and the control program. The RAM 121b is configured as a memory area (work area) in which a program, data and the like read by the CPU 121a are temporarily stored.

The I/O port 121d is connected to the above-described MFCs 241a through 241f, valves 243a through 243f, pressure sensor 245, APC valve 244, vacuum pump 246, heater 207, temperature sensor 263, rotating mechanism 267, boat elevator 115, shutter opening and closing mechanism 115s and the like.

The CPU 121a reads and executes the control program from the memory device 121c and reads the recipe from the memory device 121c according to an input of a manipulating command from the I/O device 122. To comply with the content of the read process recipe, the CPU 121a is configured to control a flow rate adjusting operation of various types of gases by the MFCs 241a through 241f, opening or closing operations of the valves 243a through 243f, an opening or closing operation of the APC valve 244, a pressure adjusting operation by the APC valve 244 based on the pressure sensor 245, starting or stopping of the vacuum pump 246, a temperature adjusting operation by the heater 207 based on the temperature sensor 263, a rotation and rotational speed adjusting operation of the boat 217 by the rotating mechanism 267, a lifting and lowering operation of the boat 217 by the boat elevator 115, an opening or closing operation of the shutter 219s by the shutter opening and closing mechanism 115s and the like.

The controller 121 may be configured by installing the above-described program stored in an external memory device 123 [for example, a magnetic tape, a magnetic disk such as a flexible disk and a hard disk, an optical disc such as a compact disc (CD) and a digital video disc (DVD), a magneto-optical disc such as an MO, and a semiconductor memory such as a Universal Serial Bus (USB) memory and a memory card] in the computer. The memory device 121c or the external memory device 123 is configured as a non-transitory computer-readable recording medium. Hereinafter, these are also collectively and simply called a recording medium. When the term "recording medium" is used in this specification, it may refer to one or both of the memory device 121c and the external memory device 123. Also, a communication line such as the Internet or a dedicated line may be used to supply the program without using the external memory device 123.

(2) Substrate Processing

An exemplary sequence of forming a film on a substrate serving as a process among manufacturing processes of a semiconductor apparatus (device) using the above-described substrate processing apparatus will be described with reference to FIG. 4. Hereinafter, in the following description, operations of respective units constituting the substrate processing apparatus are controlled by the controller 121.

In the film forming sequence illustrated in FIG. 4, a silicon oxide ($SiO_2$) film (hereinafter, referred to simply as a SiO film) serving as an oxygen-containing film is formed on the wafer 200 by performing asynchronously, that is, non-simultaneously, a cycle a predetermined number of times (n times). The cycle includes Step 1 in which HCDS gas serving as a source gas is supplied onto the wafer 200 serving as a substrate accommodated in the process container [in the process chamber 201] and Step 2 in which $O_2$ gas serving as an oxygen-containing gas and $H_2$ gas serving as a hydrogen-containing gas are supplied into the process container under a pressure less than heated atmospheric pressure.

In this specification, the above-described film forming process may be represented as follows for convenience of description. Also, the same representation will be used in the other embodiments below.

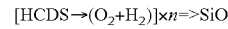

When the term "wafer" is used in this specification, it may refer to "the wafer itself," or "a laminate (aggregate) of a wafer and a predetermined layer, a film and the like formed on a surface thereof," that is, the wafer refers to a wafer including a predetermined layer, a film and the like formed on a surface thereof. In addition, when the term "a surface of the wafer" is used in this specification, it may refer to "a surface (exposed surface) of the wafer itself" or "a surface of a predetermined layer, a film and the like formed on the wafer, that is, the outermost surface of the wafer laminate."

Therefore, when it is described in this specification that "a predetermined gas is supplied to the wafer," it may mean that "a predetermined gas is directly supplied to a surface (exposed surface) of the wafer itself" or "a predetermined gas is supplied to a layer, a film and the like formed on the wafer, that is, to the outermost surface of the wafer laminate." In addition, when it is described in this specification that "a predetermined layer (or film) is formed on the wafer," it may mean that "a predetermined layer (or film) is directly formed on a surface (exposed surface) of the wafer itself" or "a predetermined layer (or film) is formed on a layer, a film and the like formed on the wafer, that is, a predetermined layer (or film) is formed on the outermost surface of the wafer laminate."

Also, the term "substrate" used in this specification is the same as the term "wafer" used in this specification.

(Wafer Charging and Boat Loading)

The plurality of wafers 200 are loaded onto the boat 217 (wafer charging). Then, as illustrated in FIG. 1, the boat 217 that supports the plurality of wafers 200 is lifted by the boat elevator 115 and loaded into the process chamber 201 (boat loading). In this state, the seal cap 219 seals the lower end of the manifold 209 through the O-ring 220b.

(Pressure and Temperature Adjusting)

The process chamber 201, that is, a space in which the wafer 200 is present is vacuum-exhausted (exhausted to a reduced pressure) by the vacuum pump 246 such that the inner pressure of the process chamber 201 reaches a desired pressure (degree of vacuum). In this case, the inner pressure of the process chamber 201 is measured by the pressure sensor 245, and the APC valve 244 is feedback controlled based on information on the measured pressure. The vacuum pump 246 continuously operates at least until processing on the wafer 200 is completed. Also, the wafer 200 in the process chamber 201 is heated to a desired temperature by the heater 207. In this case, power supply to the heater 207 is feedback controlled based on information on the temperature detected by the temperature sensor 263 such that an inside of the process chamber 201 has a desired temperature distribution. The heating of the inside of the process chamber 201 by the heater 207 is continuously performed at least until the processing on the wafer 200 is completed. Also, the rotating mechanism 267 begins to rotate the boat 217 and the wafer 200. The rotation of the boat 217 and the wafer 200 by the rotating mechanism 267 is continuously performed at least until the processing on the wafer 200 is completed.

(Film Forming Process)

Then, the following Steps 1 and 2 are sequentially performed. Also, control of the supply of $N_2$ gas through the nozzles 249e and 249f when the film forming process is performed will be described below.

[Step 1]

In this step, HCDS gas is supplied onto the wafer 200 in the process chamber 201.

HCDS gas flows into the gas supply pipe 232a by opening the valve 243a. The HCDS gas, whose flow rate is adjusted by the MFC 241a, is supplied into the process chamber 201 through the nozzle 249a and exhausted through the exhaust pipe 231. In this case, the HCDS gas is supplied onto the wafer 200. In this case, at the same time, $N_2$ gas flows into the gas supply pipe 232c by opening the valve 243c. The $N_2$ gas, whose flow rate is adjusted by the MFC 241c, is supplied into the process chamber 201 with the HCDS gas and exhausted through the exhaust pipe 231.

Also, in order to prevent HCDS gas from being introduced into the nozzle 249b, $N_2$ gas flows into the gas supply pipe 232d by opening the valve 243d. The $N_2$ gas is supplied into the process chamber 201 through the gas supply pipe 232b and the nozzle 249b and exhausted through the exhaust pipe 231.

In this case, the APC valve 244 is appropriately adjusted such that the inner pressure of the process chamber 201, for example, ranges from 1 Pa to 4000 Pa, preferably, from 67 Pa to 2666 Pa, and more preferably, from 133 Pa to 1333 Pa. A flow rate of HCDS gas controlled by the MFC 241a may range from 1 sccm to 2000 sccm, and preferably, from 10 sccm to 1000 sccm. A flow rate of N2 gas controlled by the MFC 241c and 241d may range from 100 sccm to 10000 sccm. A time period during which HCDS gas is supplied onto the wafer 200, i.e. a gas supply time (supplying time) may range from 1 second to 120 seconds, and preferably, from 1 to 60 seconds.

A temperature of the heater 207 is set such that a temperature of the wafer 200 is set to, for example, 250° C. to 700° C., preferably, 350° C. to 650° C., and more preferably, 450° C. to 600° C.

When HCDS gas is supplied onto the wafer 200 under the above-described conditions, a silicon-containing layer that contains chlorine (Cl) and has a thickness of, for example, one atomic layer to several atomic layers, is formed on the outermost surface of the wafer 200 as a first layer. The silicon-containing layer containing chlorine (Cl) may include one or both of a silicon layer containing chlorine (Cl) and an adsorption layer of HCDS. The adsorption layer of HCDS may include one or both of a physical adsorption layer of HCDS and a chemical adsorption layer of HCDS.

Here, the term "layer having a thickness of less than one atomic layer" refers to a discontinuously formed atomic layer and the term "layer having a thickness of one atomic layer" refers to a continuously formed atomic layer. The term "layer having a thickness of less than one molecular layer" refers to a discontinuously formed molecular layer and the term "layer having a thickness of one molecular layer" refers to a continuously formed molecular layer. The silicon-containing layer containing chlorine (Cl) may include both of the silicon-containing layer containing chlorine (Cl) and the adsorption layer of HCDS. However, as described above, the silicon-containing layer containing chlorine (Cl) is represented using an expression such as "one atomic layer" or "several atomic layers."

Under conditions in which HCDS gas is self-decomposed (pyrolyzed), that is, conditions causing a pyrolysis reaction of HCDS gas, when silicon is deposited on the wafer 200, the silicon layer containing chlorine (Cl) is formed. Under conditions in which HCDS gas is not self-decomposed (pyrolyzed), that is, conditions that do not cause a pyrolysis reaction of HCDS gas, when HCDS is adsorbed onto the wafer 200, the adsorption layer of HCDS is formed. Forming the silicon layer containing chlorine (Cl) on the wafer 200 is preferable since a film-forming rate is higher when the silicon layer containing chlorine (Cl) is formed on the wafer 200 than when the adsorption layer of HCDS is formed on the wafer 200. Hereinafter, the silicon-containing layer containing chlorine (Cl) is referred to simply as a silicon-containing layer for convenience of description.

When the first layer is thicker than several atomic layers, a modification action in Step 2 to be described below does not influence the entire first layer. Also, a minimum thickness of the first layer is less than one atomic layer. Therefore, the thickness of the first layer is preferably set to one atomic layer to several atomic layers. When the thickness of the first layer is set to one atomic layer or less, that is, one atomic layer or less than one atomic layer, since the modification action in Step 2 to be described below can be relatively enhanced, it is possible to reduce a time required for the modification action in Step 2. A time required for forming the first layer in Step 1 can also be reduced. As a result, it is possible to reduce a processing time for one cycle, and a total processing time can be reduced. That is, it is possible to increase a film-forming rate. Also, when the thickness of the first layer is set to one atomic layer or less, it is possible to increase controllability of film thickness uniformity.

Also, the HCDS gas supplied into the process chamber 201 is not only supplied onto the wafer 200 is but also supplied onto surfaces of members in the process chamber 201, that is, the inner wall of the reaction tube 203, surfaces of the nozzles 249a, 249b, 249e and 249f, a surface of the boat 217, the inner wall of the manifold 209, a surface of the cover 209a, the upper surface of the seal cap 219, a side surface of the rotary shaft 255, the surface of the insulating plate 218 and an inner wall of the exhaust pipe 231. When the HCDS gas supplied into the process chamber 201 is in contact with the surfaces of the members in the process chamber 201, the above-described silicon-containing layer is formed on the wafer 200 and the surfaces of the members in the process chamber 201. The silicon-containing layer formed on the surfaces of the members in the process chamber 201 may include one or both of the adsorption layer of HCDS and a silicon layer (a silicon layer containing chlorine (Cl)) similar to the silicon-containing layer formed on the wafer 200.

However, in a region (hereinafter, referred to simply as a low-temperature region) having a relatively low temperature in the process chamber 201, the HCDS gas is difficult to be pyrolyzed and the adsorption layer of HCDS is easily formed compared to a region (hereinafter, referred to simply as a high-temperature region) having a relatively high temperature in the process chamber 201. Here, the low-temperature region refers to, for example, a region in the vicinity of the opening of the process container, that is not surrounded by the heater 207, and refers to a region other than a region horizontally surrounding the wafer arrangement region. Also, the high-temperature region refers to a region that is surrounded by the heater 207, and refers to a region horizontally surrounding the wafer arrangement region. Therefore, the adsorption layer of HCDS is easily formed on the surfaces of the members in the low-temperature region, particularly among the surfaces of the members installed in the process chamber 201, for example, a lower portion of the inner wall of the reaction tube 203, the inner wall of the manifold 209, the surface of the cover 209a, under the nozzles 249a and 249b the surfaces of the nozzles 249e and 249f, the upper surface of the seal cap 219, the side surface of the rotary shaft 255, the surface of the insulating plate 218 and the inner wall of the exhaust pipe 231. Also, in the low-temperature region, HCDS is easily adsorbed and the thickness of the adsorption layer of HCDS is increased compared to the high-temperature region. Also, in metal members such as the manifold 209, the seal cap 219 and the rotary shaft 255, HCDS may be easily adsorbed and the thickness of the adsorption layer of HCDS is increased compared to other non-metallic members.

After the first layer is formed, the valve 243a is closed to stop supply of HCDS gas. In this case, while the APC valve 244 is open, the inside of the process chamber 201 is vacuum-exhausted by the vacuum pump 246, and any residual unreacted gas in the process chamber 201 or HCDS gas that has contributed to formation of the first layer is removed from the inside of the process chamber 201. In this case, while the valves 243c and 243d are open, supply of $N_2$ gas into the process chamber 201 continues. $N_2$ gas serves as a purge gas. Therefore, it is possible to increase an effect of removing a residual gas in the process chamber 201 from the inside of the process chamber 201.

In this case, the residual gas in the process chamber 201 may not be completely removed and the inside of the process chamber 201 may not be completely purged. When an amount of the residual gas in the process chamber 201 is small, there is no negative influence on Step 2 performed thereafter. Thus, there is no need to set a flow rate of $N_2$ gas supplied into the process chamber 201 to be high. For example, when the same amount of $N_2$ gas as a volume of the reaction tube 203 [the process chamber 201] is supplied, it is possible to perform purging to the extent that there is no negative influence on Step 2. Thus, when the inside of the process chamber 201 is not completely purged, a purge time decreases, thereby improving throughput. Also, it is possible to suppress unnecessary consumption of $N_2$ gas to a minimum.

As a source gas, in addition to HCDS gas, an inorganic halosilane source such as dichlorosilane ($SiH_2Cl_2$, abbreviated as DCS) gas, monochlorosilane ($SiH_3Cl$, abbreviated as MCS) gas, tetrachlorosilane, that is, silicon tetrachloride ($SiCl_4$, abbreviated as STC) gas, trichlorosilane ($SiHCl_3$, abbreviated as TCS) gas, trisilane ($Si_3H_8$, abbreviated as TS) gas, disilane ($Si_2H_6$, abbreviated as DS) gas or monosilane ($SiH_4$, abbreviated as MS) gas or an organic silane source gas such as tetrakisdimethylaminosilane ($Si[N(CH_3)_2]_4$, abbreviated as 4DMAS) gas, trisdimethylaminosilane ($Si[N(CH_3)_2]_3H$, abbreviated as 3DMAS) gas, bisdiethylaminosilane ($Si[N(C_2H_5)_2]_2H_2$, abbreviated as BDEAS) gas or bis(tertiary-butylamino)silane ($SiH_2[NH(C_4H_9)]_2$, abbreviated as BTBAS) gas may be used.

As an inert gas, in addition to $N_2$ gas, noble gases such as argon (Ar) gas, helium (He) gas, neon (Ne) gas, xenon (Xe) gas and the like may be used.

[Step 2]

After Step 1 is completed, $O_2$ gas and $H_2$ gas are supplied into the process chamber 201 and are mixed to react in the process chamber 201.

In this step, the valves 243a and 243b are open, the $O_2$ gas flows into the gas supply pipe 232b and the $H_2$ gas flows into the gas supply pipe 232a. The $O_2$ gas flowing into the gas supply pipe 232b, whose flow rate is adjusted by the MFC 241b, is supplied into the process chamber 201 through the nozzle 249b. The $H_2$ gas flowing into the gas supply pipe 232a, whose flow rate is adjusted by the MFC 241a, is supplied into the process chamber 201 through the nozzle 249a. The $O_2$ gas and the $H_2$ gas are initially mixed to react in the process chamber 201, and then exhausted through the exhaust pipe 231. Opening and closing control of the valves 243c and 243d is performed according to the same sequence as opening and closing control of the valves 243c and 243d in Step 1.

In this case, the APC valve 244 is appropriately adjusted such that the inner pressure of the process chamber 201 may be below atmospheric pressure, for example, may range from 1 Pa to 1333 Pa.

A flow rate of $O_2$ gas controlled by the MFC 241b may range from 1000 sccm to 10000 sccm. A flow rate of $H_2$ gas controlled by the MFC 241a may range from 1000 sccm to 10000 sccm. A time period during which $O_2$ gas and $H_2$ gas are supplied onto the wafer 200, i.e. a gas supply time (supplying time) may range from 1 second to 120 seconds.

The other processing conditions may be the same as the processing conditions in Step 1.

When the $O_2$ gas and the $H_2$ gas are supplied into the process chamber 201 under the above-described conditions, the $O_2$ gas and the $H_2$ gas are thermally activated (excited) and reacted in a non-plasma state under a heated and reduced atmosphere. Accordingly, a water ($H_2O$)-free oxidizing species containing oxygen such as atomic oxygen (O) is generated. Then, oxidizing is mainly performed on the first layer (the silicon-containing layer) formed on the wafer 200 in Step 1 by the oxidizing species. Since energy of the oxidizing species is higher than bond energies of a Si—Cl bond and a Si—H bond included in the silicon-containing layer, when the energy of the oxidizing species is applied to the silicon-containing layer, bonds of Si—Cl, Si—H and the like included in the silicon-containing layer are disconnected. H and Cl, whose bonds with Si are disconnected, are removed from the film and discharged as $Cl_2$, HCl and the like. Also, when bonds with H and Cl are disconnected, the remaining bonds with Si combines with O included in the oxidizing species to form a Si—O bond.

Thus, the silicon-containing layer is changed (modified) to a second layer, that is, a SiO layer having low content of impurities such as Cl and the like. With respect to the oxidizing, it is possible to significantly increase the oxidizing power compared to when only the $O_2$ gas is supplied or water vapor ($H_2O$) is supplied. That is, when the $H_2$ gas is added to the $O_2$ gas under a reduced atmosphere, it is possible to significantly increase the oxidizing power compared to when only the $O_2$ gas is supplied or the $H_2O$ gas is supplied.

Also, the oxidizing species generated in the process chamber 201 is not only supplied onto the wafer 200 is but also supplied onto the surfaces of the members in the process chamber 201. When the oxidizing species generated in the process chamber 201 is in contact with the silicon-containing layer formed on the surfaces of the members in the process chamber 201, a portion of the silicon-containing layer is changed (modified) to a SiO layer similar to the silicon-containing layer formed on the wafer 200.

However, a supply amount of the oxidizing species in the low-temperature region in the process chamber 201 is smaller than that of the oxidizing species in the high-temperature region. Also, as described above, the adsorption layer of HCDS in the low-temperature region is easily formed to be thicker than in the high-temperature region. As a result, the silicon-containing layer (a layer contains a lot of the adsorption layer of HCDS) formed in the low-temperature region is not unreactive or only partially reactive, and is likely to remain in an insufficiently oxidized state.

After the first layer (the silicon-containing layer) is changed to the second layer (the SiO layer), the valves 243a and 243b are closed to stop supply of the $O_2$ gas and the $H_2$ gas. Also, the $O_2$ gas, the $H_2$ gas or reaction by-products that are remaining in the process chamber 201 are removed from the inside of the process chamber 201 by processing sequences and processing conditions in Step 1. In this case, the residual gases in the process chamber 201 may not be completely removed, similar to as in Step 1.

As an oxygen-containing gas, in addition to the $O_2$ gas, ozone ($O_3$) gas or the like may be used. As a hydrogen-containing gas, in addition to the $H_2$ gas, deuterium (D) gas or the like may be used. Also, in the case in which an aminosilane source gas such as 4DMAS gas or 3DMAS gas is used as a source gas, when $O_3$ gas is used as an oxygen-containing gas, a film may be formed to have a sufficient (equivalent) film-forming rate without using a hydrogen-containing gas.

As an inert gas, in addition to $N_2$ gas, for example, various types of noble gases exemplified in Step 1 may be used.

(Performing a Predetermined Number of Times)

When a cycle in which Steps 1 and 2 described above are performed asynchronously, that is, performed without synchronization, is performed a predetermined number of times (n times), a SiO film having a predetermined film thickness may be formed on the wafer 200. The above-described cycle is preferably repeated multiple times. That is, the thickness of the SiO layer formed when the above-described cycle is performed once is set to be smaller than a desired film thickness, and the above-described cycle is preferably repeated multiple times to obtain the desired film thickness of the SiO film formed by stacking the SiO layer.

(Purging and Restoring to Atmospheric Pressure)

After the formation of the SiO film is completed, the valves 243c and 243d are open, $N_2$ gas is supplied into the process chamber 201 through the gas supply pipes 232c and 232d, and exhausted through the exhaust pipe 231. The $N_2$ gas serves as a purge gas. Therefore, the inside of the process chamber 201 is purged, and a residual gas in the process chamber 201 or reaction by-products are removed from the inside of the process chamber 201 (purging). Then, an atmosphere in the process chamber 201 is replaced with the inert gas (inert gas replacement) and the inner pressure of the process chamber 201 is restored to a normal pressure (restoring to atmospheric pressure).

(Boat Unloading and Wafer Discharging)

The seal cap 219 is lowered by the boat elevator 115 and the lower end of the manifold 209 is open. Also, the processed wafer 200 is unloaded (boat unloading) to the outside of the reaction tube 203 from the lower end of the manifold 209 while being supported on the boat 217. The processed wafer 200 is extracted from the boat 217 (wafer discharging).

Also, when the boat unloading is performed, the external air (the air) containing moisture may enter the inside of the process chamber 201 through the lower opening of the manifold 209, that is, an opening (a furnace port portion) of the process container even when the pressure in the process container is a pressure [positive pressure] exceeding the pressure of the external air (positive pressure). Also, the upper surface of the seal cap 219, the side surface of the rotary shaft 255 and the surface of the insulating plate 218 are exposed to atmosphere containing moisture. As described above, the adsorption layer of HCDS is formed on surfaces of the members (members in the vicinity of the opening) installed in the low-temperature region among the members in the process chamber 201, and may remain in an insufficiently oxidized state. In this state, when the boat unloading is performed, the adsorption layer of HCDS is oxidized by moisture in the air, and may be changed to reaction by-products containing chlorine (Cl). A film (deposition film) formed by deposition of the reaction by-products is brittle and tends to be relatively easily detached, and thus is likely to cause foreign matter (particles).

Hereinafter, a configuration in which the adsorption layer of HCDS formed on the surfaces of the members in the process chamber 201 reacts with moisture in the air, is changed to reaction by-products containing chlorine (Cl), a portion of the deposition film formed by deposition of the reaction by-products is detached therefrom, and foreign matter is generated will be described with reference to FIGS. 9A through 9F.

Figure 9A:
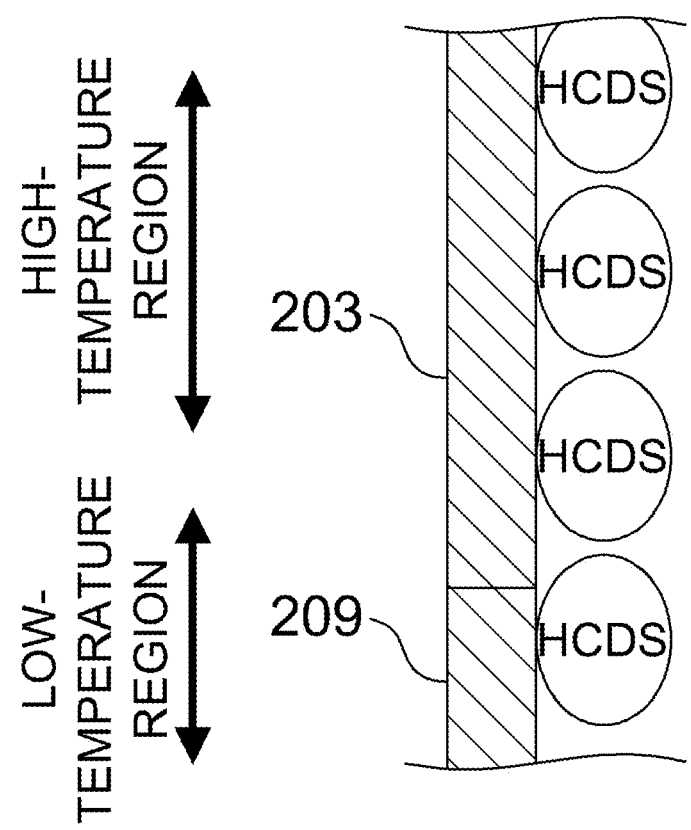
FIG. 9A is a diagram illustrating a state in which an adsorption layer of a source is formed in a process container.

When Step 1 (HCDS gas supply) described above is preformed, a silicon-containing layer is formed on the surfaces of a member in the process chamber 201, for example, the inner wall of the reaction tube 203 or the inner wall of the manifold 209 as illustrated in FIG. 9A. As described above, in the high-temperature region, one or both of the adsorption layer of HCDS and a silicon (Si) layer may be formed. Also, in the low-temperature region, the HCDS gas is difficult to be pyrolyzed, and the adsorption layer of HCDS is easily formed. In FIG. 9A, as an example, a configuration in which the adsorption layer of HCDS is formed in one or both of the high-temperature region and the low-temperature region is illustrated.

Figure 9B:
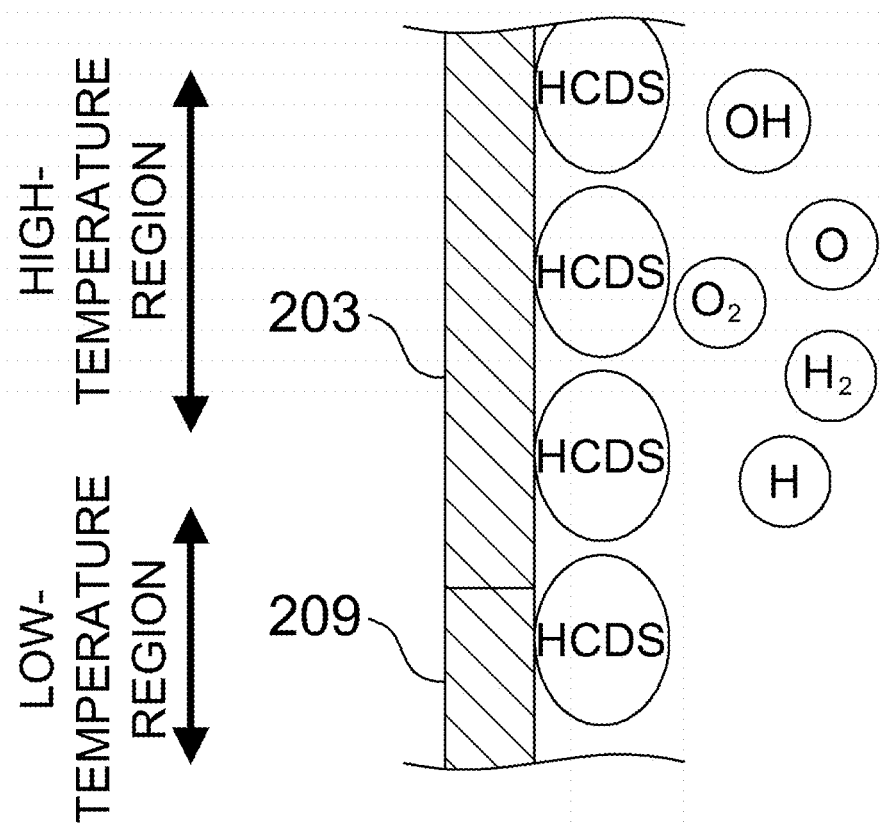
FIG. 9B is a diagram illustrating a state in which an oxidizing species is supplied onto the adsorption layer of the source formed in the process container.

Then, when Step 2 ($O_2$ gas and $H_2$ gas supply) described above is preformed, a water ($H_2O$)-free oxidizing species containing oxygen such as atomic oxygen (O) is supplied into the adsorption layer of HCDS formed in the high-temperature region as illustrated in FIG. 9B. The adsorption layer of HCDS formed in the high-temperature region in the process chamber 201 is oxidized by the oxidizing species and is changed to a SiO layer. The SiO layer is a layer formed by the oxidation of the adsorption layer of HCDS by the oxidizing species having strong oxidizing power, and a dense layer that has low impurities such as Cl and the like, is stable, and has a structurally strong bonding force (bonding force between composite materials) under high temperature conditions including the same temperature as that of the above-described wafer 200.

Figure 9C:
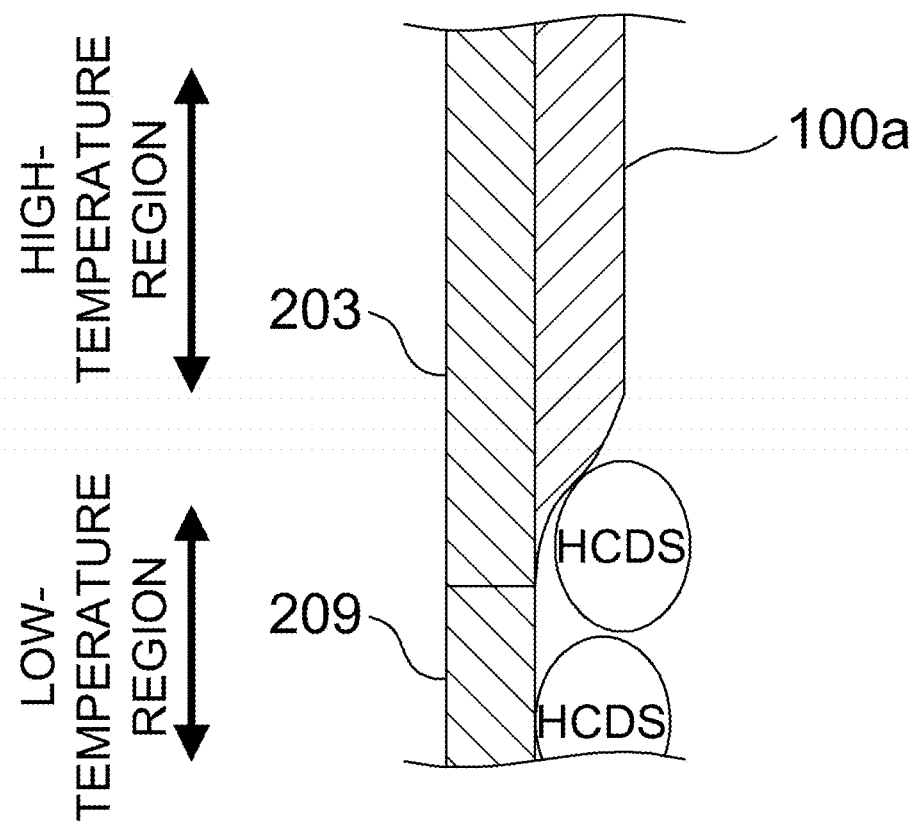
FIG. 9C is a diagram illustrating a state in which the adsorption layer of the source formed in a low-temperature region in the process container is not oxidized and remains.

Then, the above-described cycle is performed a predetermined number of times, a SiO film 100a, which is formed by stacking the SiO layer in the high-temperature region, is difficult to be detached and strong, is formed as illustrated in FIG. 9C. A strong SiO film 100a is difficult to be formed in the low-temperature region. The adsorption layer of HCDS formed in the low-temperature region is formed to be unreactive or partially reactive and may easily remain in an insufficiently oxidized state as illustrated in FIG. 9C. This is because the temperature of the region is low, the supply amount of the oxidizing species is smaller than that in the high-temperature region, and the adsorption layer of HCDS in the low-temperature region is formed to be thicker than in the high-temperature region.

After the film forming process is performed, when the boat unloading is performed, the air at room temperature may enter the inside of the process chamber 201 (specifically, in the vicinity of the opening). Also, as illustrated in FIG. 9D, moisture in the air may be supplied into the adsorption layer of HCDS remaining in an insufficiently oxidized state. The adsorption layer of HCDS is oxidized by the moisture contained in the air and is changed to reaction by-products. Since the reaction by-products are oxidized and generated by the moisture which is contained in the air at room temperature and has weak oxidizing power, the reaction by-products are unstable materials containing impurities such as Cl and the like and having a characteristic of high activity (oxidation nature).

Then, when processes from the above-described wafer charging to the wafer discharging in series [hereinafter, referred to as a batch process] are performed a predetermined number of times, a deposition film 100b formed by deposition of the reaction by-products is formed in the low-temperature region as illustrated in FIG. 9E. The deposition film 100b is a film formed by deposition of unstable materials and a film that has a structurally weak bonding force and low density. Therefore, the deposition film 100b has a characteristic of being brittler than the SiO film 100a formed in the high-temperature region and is easily detached. The deposition film 100b is also generated on the surface of the cover 209a, under the nozzles 249a and 249b, the surfaces of the nozzles 249e and 249f, the upper surface of the seal cap 219, the side surface of the rotary shaft 255, the surface of the insulating plate 218, the inner wall of the exhaust pipe 231 and the like.

In FIG. 9F, a configuration in which foreign matter 100p is generated in the process chamber 201 when the deposition film 100b is detached is illustrated. The foreign matter 100p may be suspended inside of the process chamber 201 and enter the SiO film that is formed on the wafer 200, and thus the film quality of the SiO film may be reduced. Also, the quality of the semiconductor apparatus (device) manufactured on the wafer 200 may be reduced. In order to suppress the generation of the foreign matter 100p, a cleaning process in the process chamber 201 may be performed at a high frequency. However, in this case, the maintenance time in the substrate processing apparatus, that is, downtime is increased, and thus productivity may be reduced.

Also, since the reaction by-products constituting the deposition film 100b contain a lot of chlorine (Cl), the reaction by-products have a characteristic of easily generating a harmful gas. Also, chlorine (Cl) contained in the reaction by-products may cause damage such as corrosion or the like to metal members such as the manifold 209, the seal cap 219 and the rotary shaft 255. As a result, the frequency of maintenance of the substrate processing apparatus is increased, and thus productivity may be reduced or the quality of the device may be degraded due to foreign matter generated from the damaged metal member.

(3) Performing Purge Process on Opening

In order to address the above-described challenge, in the present embodiment, a purge process in which $N_2$ gas serving as an inert gas is directly supplied into the opening of the process container is performed. Hereinafter, the process (referred to as an opening purge process) will be described in detail.

(During Performance of Film Forming Process)

Figure 4:
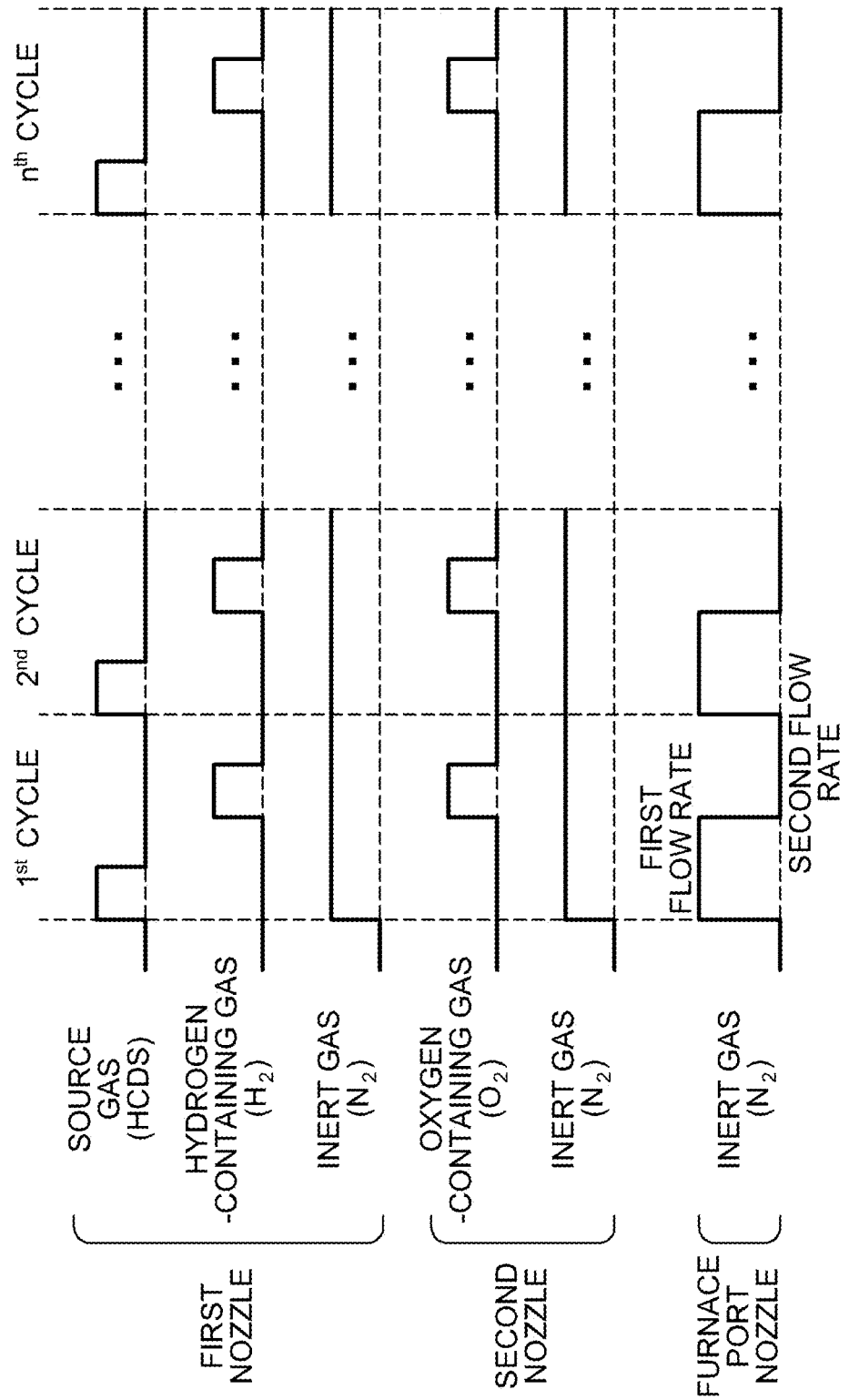
FIG. 4 is a film forming sequence of the embodiment of the present invention.

As illustrated in FIG. 4, in Step 1 in which HCDS gas is supplied onto the wafer 200 in the process container, $N_2$ gas is directly supplied onto the inner wall of the manifold 209, that is, the inner wall of the opening of the process container at a predetermined first flow rate.

In this step, the valves 243e and 243f are open and $N_2$ gas flows into the gas supply pipes 232e and 232f. The $N_2$ gas, whose flow rate is adjusted by the MFCs 241e and 241f, is supplied onto the inner wall of the manifold 209 through the nozzles 249e and 249f and the purge space 201a, and then is supplied into the process chamber 201 through the gas distribution slit 209s and exhausted through the exhaust pipe 231. When the $N_2$ gas is supplied onto the inner wall of the opening of the process container, the supply of HCDS gas onto the inner wall of the opening may be suppressed and the formation of the adsorption layer of HCDS on the inner wall of the opening may be suppressed. Also, when the flow rate of $N_2$ gas supplied through the nozzles 249e and 249f is increased to the predetermined first flow rate, for example, a gas curtain (anti-intrusion barrier) may be formed in the vicinity of the opening, and it is possible to suppress entering (diffusion) of the HCDS gas into the vicinity of the opening. Also, it is possible to sufficiently decrease the concentration of the HCDS gas that enters the vicinity of the opening. As a result, it is possible to suppress the formation of the adsorption layer of HCDS in the low-temperature region in the vicinity of the opening.

The first flow rate is preferably higher than the flow rate (hereinafter, referred to as a source gas flow rate) of the HCDS gas supplied into the process chamber 201 in Step 1 of the film forming process. Specifically, the first flow rate may range from 2.5 times to 10 times a flow rate of the source gas, preferably, from 2.5 times to 7.5 times, and more preferably, from 2.5 times to 5 times. When the source gas flow rate may be in a range of the above-described process conditions, the first flow rate may range from 0.5 slm to 2 slm, preferably, from 0.5 slm to 1.5 slm, and more preferably, from 0.5 slm to 1 slm.

When the first flow rate is set to the flow rate less than 2.5 times the flow rate of the source gas, for example, less than 0.5 slm, by supplying the $N_2$ gas onto the inner wall of the opening of the process container, the above-described action is difficult to be obtained, and thus the adsorption layer of HCDS is easily formed in the low-temperature region in the vicinity of the opening. When the first flow rate is set to the flow rate 2.5 times or more the flow rate of the source gas, for example, 0.5 slm or more, by supplying the $N_2$ gas onto the inner wall of the opening, the above-described action may be obtained sufficiently, and thus it is possible to suppress sufficiently the formation of the adsorption layer of HCDS in the low-temperature region in the vicinity of the opening.

When the first flow rate is set to the flow rate more than 10 times the flow rate of the source gas, for example, more than 2 slm, the uniformity of the film forming process may be reduced. For example, when a large amount of the $N_2$ gas supplied onto the inner wall of the opening is diffused into the process chamber 201, specifically, the HCDS gas supplied onto the wafer 200 retained at a lower portion of the boat 217 is diluted, the concentration thereof may be smaller than the concentration of HCDS gas supplied onto the wafer 200 retained at a center portion of the boat 217 or an upper position of the boat 217. Therefore, the film thickness uniformity between the wafers with the SiO films may be reduced. Also, the concentration of HCDS gas supplied onto the wafer 200 at a lower portion of the boat 217 is decreased (an amount of supply is lacking), and thus the film thickness uniformity within planes of the wafers of the SiO films formed on the wafers 200 may be reduced. When the first flow rate is set to a flow rate of 10 times or less the flow rate of the source gas, for example, less than 2 slm, it is possible to address this challenge. When the first flow rate is set to a flow rate of 7.5 times or less the flow rate of the source gas, for example, less than 1.5 slm, it is possible to more improve the uniformity of the film forming process. When the first flow rate is set to a flow rate of 5 times or less the flow rate of the source gas, for example, less than 1 slm, it is possible to more reliably improve the uniformity of the film forming process.

However, even though the opening purge process is performed in Step 1 under the above-described process conditions, the HCDS gas may slightly enter the vicinity of the opening of the process container and may be in contact with the inner wall of the opening. Also, the adsorption layer of HCDS may be slightly formed on the inner wall of the opening. The adsorption layer of HCDS formed on the inner wall of the opening becomes the cause of the foreign matter 100p as described above.

Therefore, in Step 2 in which the $O_2$ and the $H_2$ gas are supplied onto the wafer 200 in the process container as illustrated in FIG. 4, the $N_2$ gas is supplied onto the inner wall of the opening of the process container at a second flow rate smaller than the above-described first flow rate.

FIG. 4 illustrates an example in which the second flow rate is set to 0, that is, an example in which the valves 243e and 243f are closed to stop the supply of $N_2$ gas onto the inner wall of the opening. When the flow rate of the $N_2$ gas is set to be the same as the second flow rate, it is possible to supply (diffuse) the $O_2$ gas and the $H_2$ gas supplied into the process chamber 201, that is, an oxidizing species containing oxygen such as atomic oxygen (O) having strong oxidizing power into the vicinity of the opening. Also, even when the adsorption layer of HCDS is slightly formed on the inner wall of the opening, the layer is aggressively oxidized by the oxidizing species having strong oxidizing power, and thus it is possible to change to a SiO layer that has low impurities such as Cl and the like, is stable, and is dense.

Also, the second flow rate may be set to a smaller flow rate than the first flow rate, for example, a flow rate less than 0.5 slm, and preferably a flow rate 0.2 slm or less. When the second flow rate is set to the smaller flow rate than the first flow rate, the above-described effects may be obtained. However, in order to efficiently diffuse the oxidizing species in the vicinity of the opening, the second flow rate is preferably set to be small, for example, 0.1 slm or less, and is more preferably set to 0 as illustrated in FIG. 4.

In any of Steps 1 and 2, as an inert gas supplied onto the inner wall of the opening, in addition to $N_2$ gas, for example, various types of noble gases exemplified in the above-described film forming process may be used.

(During Performance of Other Processes)

While the boat loading process or the boat unloading process is performed, the opening of the process container may be open, that is, the air containing moisture may easily enter the inside of the process container through the opening.

Figure 5:
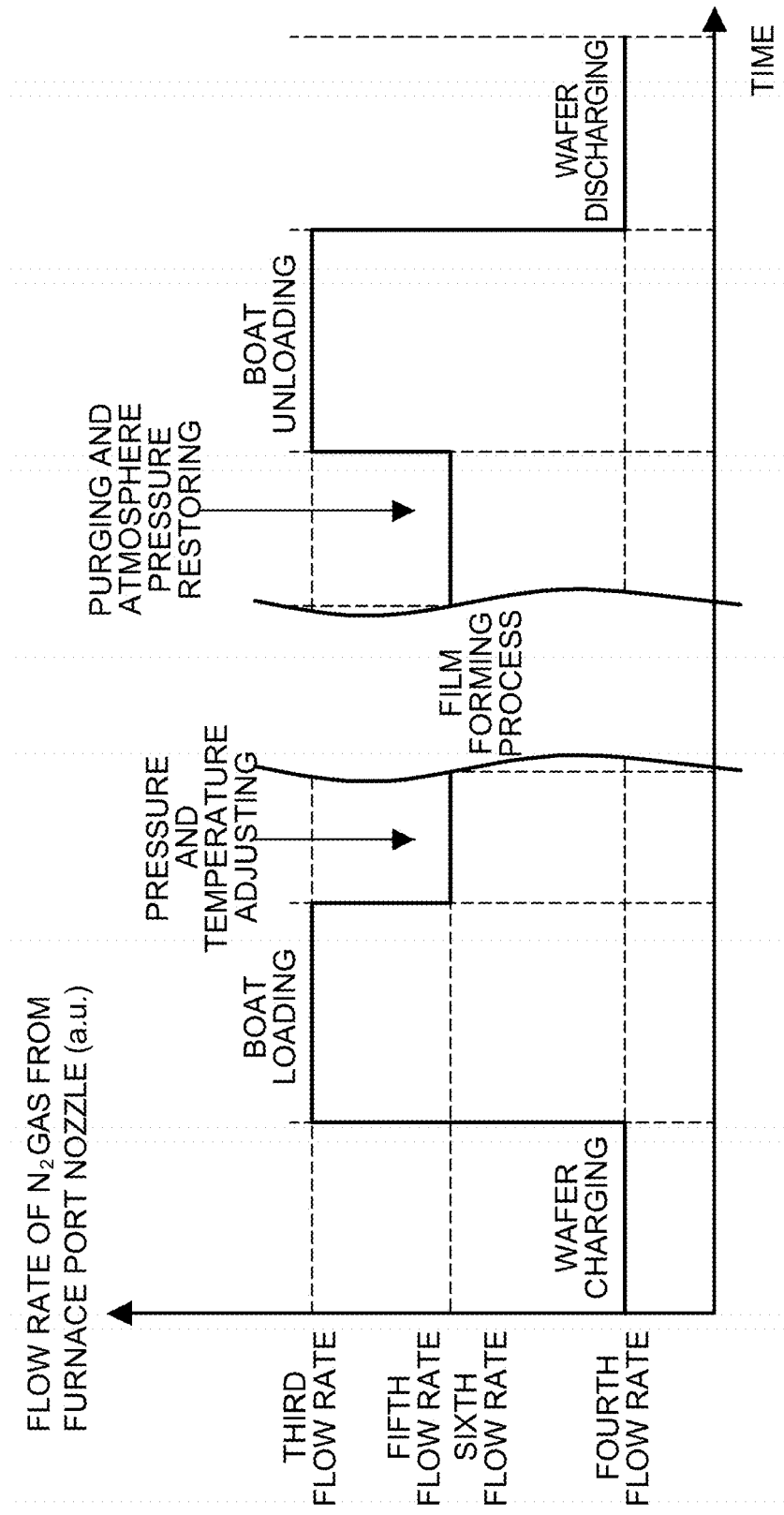
FIG. 5 is a substrate processing sequence of the embodiment of the present invention.

Thus, in the present embodiment, while at least one of the boat loading process and the boat unloading process is performed, $N_2$ gas is supplied onto the inner wall of the opening of the process container at a third flow rate higher than the above-described first flow rate. FIG. 5 illustrates an example in which an opening purge process is performed while both of the boat loading process and the boat unloading process are performed. A vertical axis of FIG. 5 represents a flow rate (a.u.) of $N_2$ gas supplied onto the inner wall of the opening, and a horizontal axis thereof represents an elapsed time.

When the opening purge process is performed as described above, a gas curtain is formed in the vicinity of the opening which is open, and it is possible to suppress the entering of the air containing moisture in the vicinity of the opening, that is, the contact of the air containing moisture with the inner wall of the opening. As a result, even when the adsorption layer of HCDS is slightly formed on the inner wall of the opening, it is possible to suppress the oxidization of the layer by the moisture contained in the air, that is, the change to unstable materials containing a lot of impurities such as Cl and the like.

The third flow rate may be higher than the first flow rate, for example, ranging of 2 slm to 10 slm, and preferably, from 3 slm to 5 slm.

When the third flow rate is set to less than 2 slm, the above-described action is difficult to be obtained by supplying the $N_2$ gas onto the inner wall of the opening which is open, and thus the air containing moisture is easily in contact with the inner wall of the opening. When the third flow rate is set to 2 slm or more, the above-described action is obtained sufficiently by supplying the $N_2$ gas onto the inner wall of the opening which is open, and thus it is possible to suppress the contact of the air containing moisture with the inner wall of the opening. When the third flow rate is set to 3 slm or more, the above-described action is obtained more reliably and thus it is possible to more reliably suppress the contact of the air containing moisture with the inner wall of the opening.

When the third flow rate is set to more than 10 slm, the foreign matter present in the vicinity of the opening may enter the inside of the process chamber 201 or a position shift may be caused while the wafer 200 supported by the boat 217 is transferred. When the third flow rate is set to 10 slm or less, it is possible to address this challenge. When the third flow rate is set to 5 slm or less, it is possible to more reliably address the above-described challenge.

The opening purge process may be performed only while the boat loading process is performed, and may be performed only while the boat unloading process is performed. However, in order to obtain reliably the above-described effects, the opening purge process is preferably performed while both of the boat loading process and the boat unloading process are performed.

The other processes, that is, all of the wafer charging process, the pressure and temperature adjusting process, the purge and atmosphere pressure restoring process and the wafer discharging process are performed in a state in which the opening of the process container is sealed by the shutter 219s or the seal cap 219. Accordingly, while the processes are performed, $N_2$ gas serving as an inert gas may be supplied onto the inner wall of the opening of the process container at a flow rate no more than the above-described third flow rate as illustrated in FIG. 5.

For example, when the wafer charging process or the wafer discharging process is performed, $N_2$ gas may be supplied onto the inner wall of the opening of the process container at a fourth flow rate less than the above-described third flow rate. The fourth flow rate may range from 0.1 slm to 0.5 slm. Also, the fourth flow rate may be zero, and thus the supply of the $N_2$ gas onto the inner wall of the opening may be stopped.

Also, for example, in the pressure and temperature adjusting process, $N_2$ gas may be supplied onto the inner wall of the opening of the process container at a fifth flow rate no more than the above-described third flow rate. The fifth flow rate may range from 0.5 slm to 10 slm, for example, 3 slm. In this case, even when the adsorption layer of HCDS remains on the inner wall of the opening of the process container, it is possible to prevent the residual adsorption layer of HCDS from being in contact with moisture contained in the air.

Also, in the purge and atmosphere restoring pressure process, $N_2$ gas may be supplied onto the inner wall of the opening of the process container at a sixth flow rate no more than the above-described third flow rate. The sixth flow rate may range from 0.5 slm to 10 slm, for example, 3 slm. In this case, while the film forming process is performed, some unreacted HCDS attached to the opening of the process container is separated from the inner wall of the opening, and thus, may be discharged from the inside of the process container.

Also, in any of the processes illustrated in FIG. 5, as an inert gas supplied onto the inner wall of the opening, in addition to $N_2$ gas, for example, various types of noble gases exemplified in the above-described film forming process may be used.

(4) Effects of the Present Embodiment

According to the present embodiment, one or a plurality of effects to be described below will be obtained.

When Step 1 in which HCDS gas is supplied is performed, it is possible to suppress the diffusion of the HCDS gas into the vicinity of the opening by supplying $N_2$ gas onto the inner wall of the opening of the process container at a first flow rate. As a result, it is possible to suppress the formation of the adsorption layer of HCDS in the low-temperature region in the vicinity of the opening.

When Step 2 in which $O_2$ gas and $H_2$ gas are supplied is performed, it is possible to facilitate (allow) the diffusion of an oxidizing species into the vicinity of the opening by supplying $N_2$ gas onto the inner wall of the opening of the process container at a second flow rate smaller than the first flow rate. As a result, even when the adsorption layer of HCDS is barely formed in the low-temperature region in the vicinity of the opening, the adsorption layer of HCDS is oxidized, and thus is possible to change to a SiO layer that has low impurities such as Cl and the like, is stable, and is dense.

When at least one of the boat loading process and the boat unloading process is performed, it is possible to suppress the entering of the air containing moisture in the vicinity of the opening by supplying $N_2$ gas onto the inner wall of the opening of the process container at a third flow rate higher than the above-described first flow rate. As a result, even when the adsorption layer of HCDS is slightly formed on the inner wall of the opening, it is possible to suppress the change of the layer to unstable materials.

In this case, it is possible to suppress the generation of the foreign matter 100p in the process container, and to improve yield by improving the quality of the film forming process. Also, the cleaning frequency in the process chamber 201 is reduced, and thus it is possible to improve the productivity of the substrate processing apparatus. Also, it is possible to suppress the corrosion of metal members such as the manifold 209 and the like, and to improve the productivity by reducing the maintenance frequency of the substrate processing apparatus. Also, it is possible to suppress the generation of the foreign matter from the metal members, and to improve the quality of the film forming process. Also, it is possible to suppress the generation of harmful gases in the vicinity of the opening.

These effects may be obtained similarly when a gas other than HCDS gas serving as a source gas is used, when a gas other than $O_2$ gas serving as an oxygen-containing gas is used, or when a gas other than $H_2$ gas serving as a hydrogen-containing gas is used. Also, these effects may be obtained similarly when a gas other than $N_2$ gas serving as an inert gas is used.

Other Embodiments of the Present Invention

Hereinafter, embodiments of the present invention have been specifically described above. The present invention is not limited to the above-described embodiments, but may be variously changed without departing from the scope of the invention.

Figure 8:
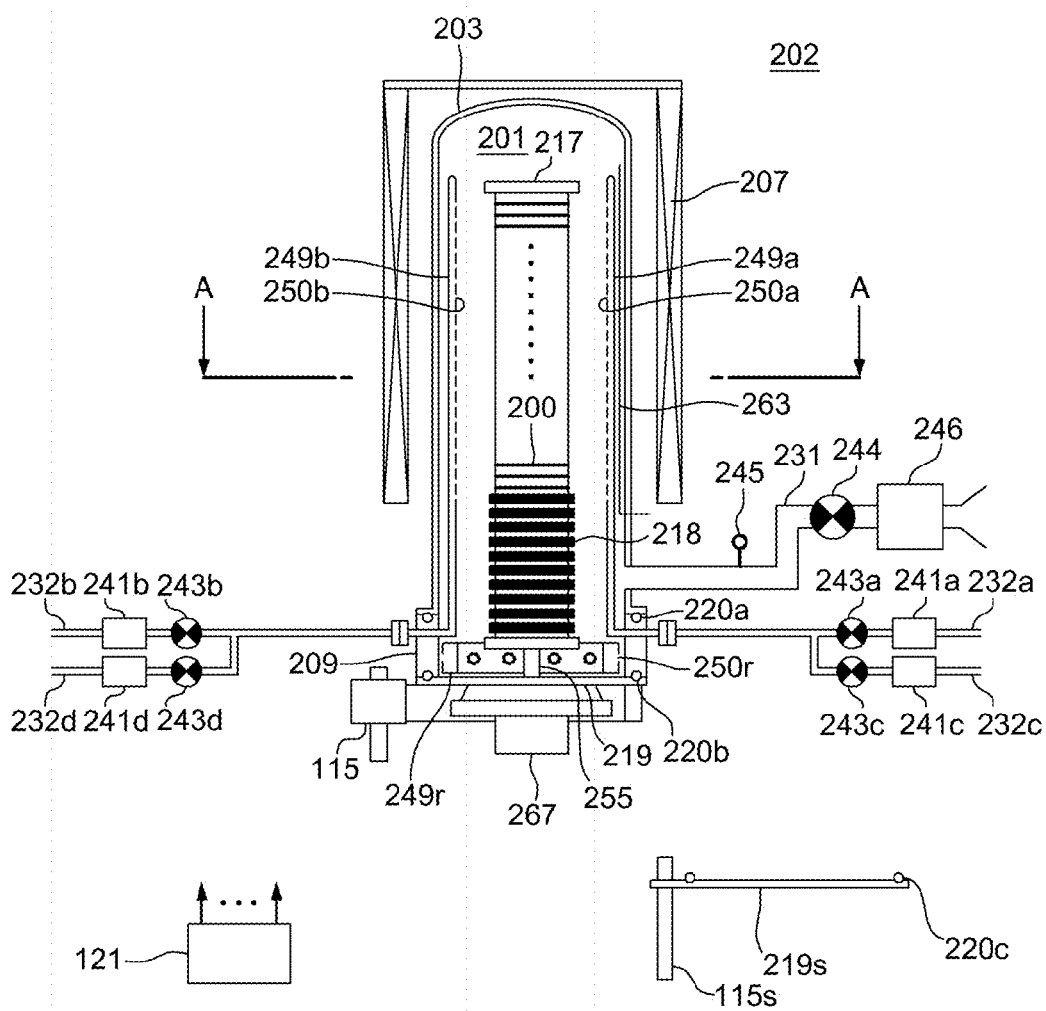
FIG. 8 is a schematic configuration diagram illustrating a processing furnace of a substrate processing apparatus preferably used in another embodiment of the present invention and is a longitudinal sectional view illustrating the processing furnace.

For example, the supply of $N_2$ gas onto the inner wall of the opening may be performed using a purge ring 249r (ring nozzle) illustrated in FIG. 8 rather than the nozzles 249e and 249f. The purge ring 249r is made of, for example, quartz, silicon carbide (SiC) or the like, and is configured as a ring-shaped member including a ring-shaped space (buffer space) therein. The purge ring 249r is disposed at a position facing the inner wall of the manifold 209, and is concentrically installed with respect to the manifold 209. A plurality of gas supply holes 250r are open at an outer circumference surface of the purge ring 249r, that is, a surface facing the inner wall of the manifold 209. The gas supply holes 250r are configured to spray a gas in a horizontal direction toward the inner wall of the manifold 209 or in a diagonally upward direction [a direction of a diagonally upward outer side from a lower inside of the inner wall of the manifold 209] toward the inner wall of the manifold 209. The gas supply holes 250r may be installed at the inner wall of the manifold 209 and a surface facing the seal cap 219. The plurality of gas supply holes 250r are installed at equal intervals along the inner circumference direction of the manifold 209. An inert gas such as $N_2$ gas or the like is supplied into the ring-shaped space in the purge ring 249r through the gas supply system similar to the inert gas supply system or the opening purge gas supply system of the above-described embodiment. When the opening purge process is performed using the purge ring 249r, it is possible to supply more directly the inert gas onto the inner wall of the opening of the process container from a facing surface thereof. When the inert gas is more directly supplied onto the inner wall of the opening, it is possible to suppress more effectively the formation of the adsorption layer of HCDS on the inner wall of the opening. Also, when the $N_2$ gas is sprayed in a direction of diagonally upward outer side from the lower inside of the inner wall of the manifold 209, it is possible to suppress more effectively the diffusion of the HCDS gas into the vicinity of the opening.

Also, for example, in Step 2 in which $O_2$ gas and $H_2$ gas are supplied onto the wafer 200 in the process container, an oxidizing gas such as $O_2$ gas, $H_2$ gas and the like may be directly supplied onto the inner wall of the opening of the process container. In this case, for example, the oxidizing gas may be supplied into the purge space 201a through the nozzles 249e and 249f rather than the opening purge gas supply system. Also, for example, the oxidizing gas may be supplied onto the inner wall of the manifold 209 through the purge ring 249r rather than the opening purge gas supply system. When the oxidizing gas is directly supplied onto the inner wall of the opening, the adsorption layer of HCDS slightly formed on the inner wall of the opening is more reliably oxidized, and thus is easily changed to a stable and dense SiO film.

Also, for example, in the above-described embodiment, an example in which a source gas is supplied and then a reaction gas is supplied has been described. The present invention is not limited thereto, but the supply order of the source gas and reaction gas may be conversely changed. That is, the reaction gas is supplied and then the source gas may be supplied. As the supply order is changed, it is possible to change the film quality or composition ratio of the formed film.

Also, for example, in the above-described embodiment, an example in which a chlorosilane source gas is used as a source gas has been described. The present invention not limited thereto, but a halosilane source gas, for example, a fluorosilane source gas, a bromosilane source gas or an iodosilane source gas other than the chlorosilane source gas may be used. Also, as a source gas, in addition to silicon (Si), a gas containing a semiconductor element such as germanium (Ge) or the like may be used. Also, as a source gas, a gas containing a metal element such as titanium (Ti), zirconium (Zr), hafnium (Hf), tantalum (Ta), niobium (Nb), molybdenum (Mo), tungsten (W), aluminum (Al) or the like may be used. In this case, processing conditions may be the same as, for example, the processing conditions of the above-described embodiment.

A recipe (a program in which processing sequences, processing conditions and the like are described) used in the film forming process may preferably be separately prepared according to processing content (a film type, a composition ratio, film quality, a film thickness, processing sequences, processing conditions and the like of the thin film to be formed), and may be preferably stored in the memory device 121c through telecommunication lines or the external memory device 123. Also, when the various types of processes are started, the CPU 121a, preferably, appropriately selects a recipe from the plurality of recipes stored in the memory device 121c according to processing content. In such a configuration, it is possible to generally and repeatedly form the thin film having various film types, composition ratios, film qualities, and film thicknesses in the single substrate processing apparatus. Also, it is possible to decrease an operation load (such as a load for inputting processing sequences or processing conditions) of an operator, thereby preventing operation errors and quickly starting the substrate processing.

The above-described recipe is not limited to a newly generated process recipe, but may be prepared, for example, by changing the existing recipe that is previously installed in the substrate processing apparatus. When the recipe is changed, the changed recipe may be installed in the substrate processing apparatus through the telecommunication lines or the non-transitory computer-readable recording medium for recording the recipe. Also, by manipulating the I/O device 122 provided in the existing substrate processing apparatus, the existing recipe that is previously installed in the substrate processing apparatus may be directly changed.

Also, the above-described various embodiments may be appropriately combined and used. Also, processing conditions in this case may be the same as, for example, the processing conditions of the above-described embodiment.

EMBODIMENTS

Hereinafter, evaluation results that support the effects obtained in the above-described embodiment will be described.

(Evaluation of the Number of Particles)

As a first evaluation, a process in which a SiO film having a film thickness of 800 Å is formed on the plurality of wafers by the film forming sequence illustrated in FIG. 4 using the substrate processing apparatus illustrated in FIG. 1 was performed multiple times. HCDS gas was used as a source gas, and $O_2$ gas and $H_2$ gas were used as reaction gases. Processing conditions of the film forming process were maintained in a range of the processing conditions described in the above-described embodiment. When the film forming process is performed, the opening purge process was performed in the same processing order as the above-described embodiment. The processing conditions of the opening purge process were maintained in a range of the processing conditions described in the above-described embodiment. Also, for each time to perform the film forming process, the number of particles of foreign matter (having a diameter of 0.08 μm or more) attached to the wafers after the film forming process was measured.

As a second evaluation, a process in which a SiO film having a film thickness of 800 Å is formed on the plurality of wafers by the same processing sequence and processing conditions as the first evaluation using the substrate processing apparatus illustrated in FIG. 1 was performed multiple times. When the film forming process was performed, the above-described opening purge process was not performed. That is, in a step in which HCDS gas is supplied onto the wafer and a step in which $O_2$ gas and $H_2$ gas are supplied onto the wafer, the supply of $N_2$ gas onto the inner wall of the opening was not performed. Also, for each time to perform the film forming process, the number of particles of foreign matter (having a diameter of 0.08 μm or more) attached to the wafers after the film forming process was measured.

Figure 6:
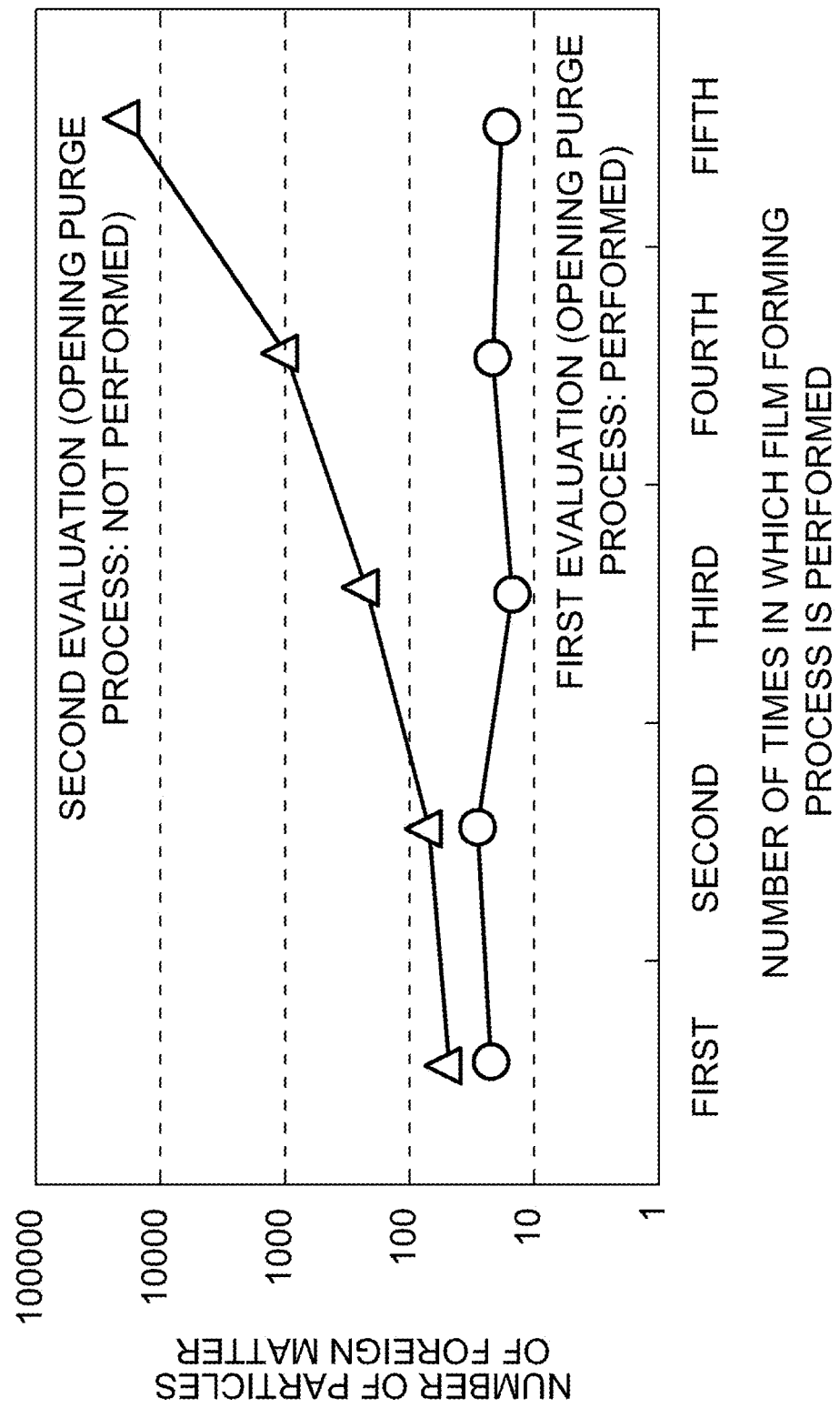
FIG. 6 is a graph illustrating evaluation results of the number of particles in a process container.

FIG. 6 is a graph for describing evaluation results of the number of particles. A horizontal axis of FIG. 6 represents the number of times in which the film forming process was performed, and a vertical axis of FIG. 6 represents the number of particles of foreign matter detected on the wafer. In FIG. 6, in the second evaluation (represented as the mark "Δ") in which the opening purge process was not performed, it may be seen that the number of the particles attached to the wafers is increased as the film forming process is repeated. On the other hand, in the first evaluation (represented as the mark "O") in which the opening purge process is performed, it may be seen that the attachment of the particles to the wafers may be suppressed even when the film forming process is repeated. That is, it may be seen that the generation of particles in the process container may be suppressed.

(Evaluation of Film Thickness Uniformity within Planes)

The SiO film was formed on the plurality of wafers by the film forming sequence illustrated in FIG. 4 using the substrate processing apparatus illustrated in FIG. 1, and Samples 1 through 3 were prepared. In the samples, HCDS gas was used as a source gas, and $O_2$ gas and $H_2$ gas were used as reaction gases. Processing conditions of the film forming process were maintained in a range of the processing conditions described in the above-described embodiment. When the samples were prepared, the opening purge process was performed with the same processing sequence as the above-described embodiment. $N_2$ gas was used as an inert gas. As the processing conditions of the opening purge process when Samples 1 through 3 were prepared, a first flow rate was set to 0.5 slm, 1 slm or 2 slm, and a second flow rate was set to 0 slm (the supply of $N_2$ gas was not performed).

Also, an average film thickness of the SiO films and film thickness uniformity within planes of the wafers (hereinafter, referred to as WiW) in Samples 1 through 3 was evaluated. The WiW (±%) is a value defined as {(a maximum value of the film thickness within planes of the wafers−a minimum value of the film thickness within planes of the wafers)/(2×an average value of the film thickness within planes of the wafers)}×100. As the value is decreased, an increasingly uniform film thickness within planes of the wafers is indicated. In this evaluation, the film thicknesses of the SiO films were measured at 49 places within planes of the wafers, and an average film thickness and WiW were calculated based on the measured values.

Figure 7A:
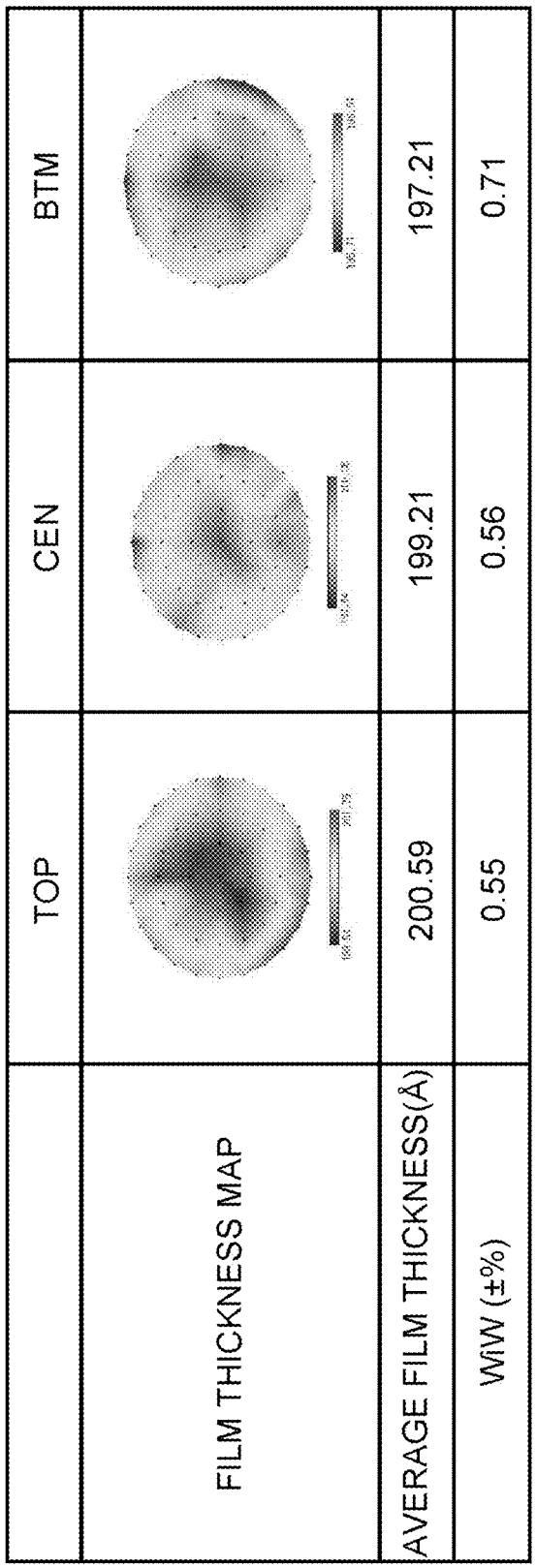
FIG. 7A is a table illustrating evaluation results of a film thickness in an opening purge process at a first flow rate of 0.5 slm.
Figure 7B:
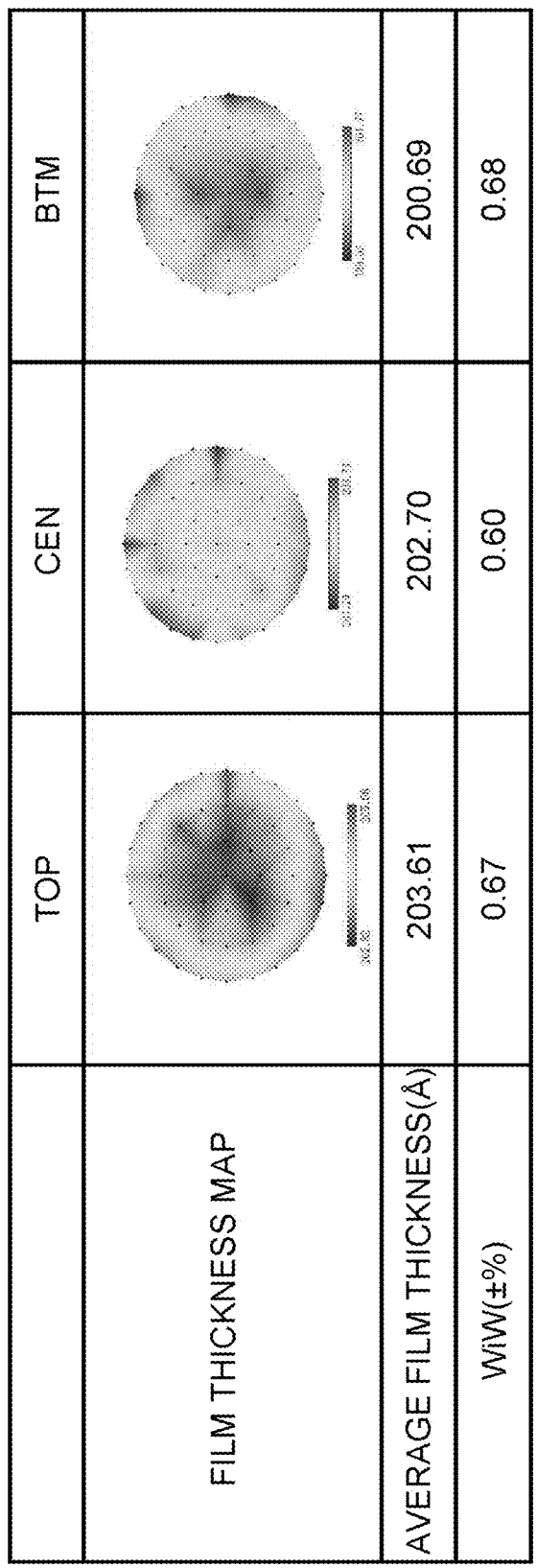
FIG. 7B is a table illustrating the evaluation results of the film thickness in the opening purge process at the first flow rate of 1 slm.
Figure 7C:
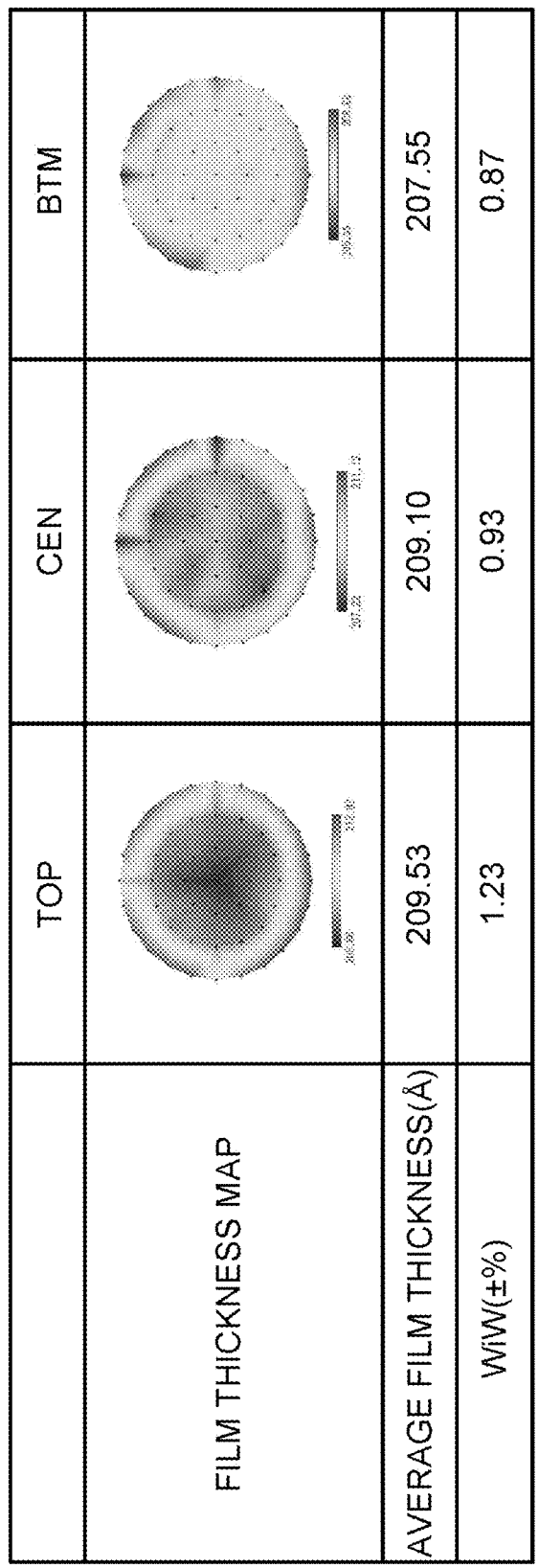
FIG. 7C is a table illustrating the evaluation results of the film thickness in the opening purge process at the first flow rate of 2 slm.

In FIGS. 7A through 7C, evaluation results of film thickness maps of the SiO films, average film thicknesses (Å) and WiWs (±%) in Samples 1 through 3 are illustrated. Results measured from the wafer disposed at the top of the boat ("TOP"), results measured from the wafer disposed at a center portion of the boat ("CEN") and results measured from the wafer disposed at the bottom of the boat ("BTM") are illustrated in each of these drawings. According to these drawings, in any of Samples 1 through 3, it may be seen that the average film thicknesses (Å) are about the same and the WiWs (±%) are good. That is, when the first flow rate ranges from 0.5 slm to 2 slm, it may be seen that a film-forming rate is prevented from being reduced and it is possible to prevent the film thickness uniformity within planes from being degraded.

According to the present invention, an amount of particles in a process container can be reduced.

Preferred Embodiments of the Present Invention

Hereinafter, preferred embodiments according to the present invention are supplementarily noted.

Supplementary Note 1

According to an aspect of the present invention, there is provided a method of manufacturing a semiconductor device or a substrate processing method including: (a) supplying a source gas to a substrate in a process container; (b) (directly) supplying an inert gas to an inner wall of an opening of the process container at a first flow rate while performing the step (a); (c) supplying a reactive gas to the substrate in the process container; and (d) (directly) supplying the inert gas to the inner wall of the opening of the process container at a second flow rate lower than the first flow rate while performing the step (c).

Supplementary Note 2

In the method of manufacturing the semiconductor device or the substrate processing method of Supplementary note 1, preferably, the supply of the inert gas to the inner wall of the opening of the process container may be stopped while performing the step (c). That is, the second flow rate may be zero (0).

Supplementary Note 3

In the method of manufacturing the semiconductor device or the substrate processing method of any one of Supplementary notes 1 and 2, preferably, further including: (e) loading the substrate into the process container; (f) unloading the substrate from the process container; and (g) supplying the inert gas to the inner wall of the opening of the process container at a third flow rate higher than the first flow rate while performing the step (e), the step (f) or the steps (e) and (f).

Supplementary Note 4

In the method of manufacturing the semiconductor device or the substrate processing method of any one of Supplementary notes 1 through 3, preferably, the process container may include a reaction tube and a manifold supporting the reaction tube.

Supplementary Note 5

In the method of manufacturing the semiconductor device or the substrate processing method of Supplementary note 4, preferably, the opening is disposed at the manifold.

Supplementary Note 6

In the method of manufacturing the semiconductor device or the substrate processing method of any one of Supplementary notes 1 through 5, preferably, the inert gas is further supplied to a gap between the inner wall and a cover covering the inner wall in the steps (b) and (d). The cover may be made of a material such as quartz.

Supplementary Note 7

In the method of manufacturing the semiconductor device or the substrate processing method of any one of Supplementary notes 1 through 5, preferably, the inert gas is (directly) supplied to the inner wall from a direction facing the inner wall in the steps (b) and (d).

Supplementary Note 8

In the method of manufacturing the semiconductor device or the substrate processing method of any one of Supplementary notes 1 through 7, preferably, the source gas may include a predetermined element and a halogen element. The predetermined element may include a metal element or a semiconductor element selected from a group consisting of silicon, germanium and the like. The halogen element may include an element selected from a group consisting of chlorine (Cl), fluorine (F), bromine (Br) and iodine (I).

Supplementary Note 9

In the method of manufacturing the semiconductor device or the substrate processing method of any one of Supplementary notes 1 through 8, preferably, the source gas may include a halosilane gas. The halosilane gas may include a gas selected from a group consisting of a chlorosilane gas, a fluorosilane gas, a bromosilane gas and an iodosilane gas.

Supplementary Note 10

In the method of manufacturing the semiconductor device or the substrate processing method of any one of Supplementary notes 1 through 9, preferably, the reactive gas may include an oxygen-containing gas.

Supplementary Note 11

In the method of manufacturing the semiconductor device or the substrate processing method of Supplementary note 10, preferably, the reactive gas may further include a hydrogen-containing gas.

Supplementary Note 12

In the method of manufacturing the semiconductor device or the substrate processing method of any one of Supplementary notes 1 through 11, preferably, the manifold (the opening) may include a metal member.

Supplementary Note 13

In the method of manufacturing the semiconductor device or the substrate processing method of any one of Supplementary notes 1 through 12, preferably, further including: (h) (directly) supplying the reactive gas to the inner wall of the opening of the process container while performing the step (c). By performing the step (h), the reactive gas may be contact with the inner wall of the opening of the process container.

Supplementary Note 14

According to another aspect of the present invention, there is provided a method of manufacturing a semiconductor device or a substrate processing method including: (a) supplying a source gas to a substrate in a process container; and (b) supplying a reactive gas to the substrate; and (c) (directly) supplying an inert gas to an inner wall of an opening of the process container while performing the steps (a) and (b), wherein a flow rate of the inert gas supplied while performing the step (a) is different from that of the inert gas supplied while performing the step (b).

Supplementary Note 15

In the method of manufacturing the semiconductor device or the substrate processing method of Supplementary note 14, preferably, the inert gas may be supplied to the inner wall of the opening of the process container while performing the step (a) and the supply of the inert gas to the inner wall of the opening of the process container may be stopped while performing the step (b).

Supplementary Note 16

According to still another aspect of the present invention, there is provided a method of manufacturing a semiconductor device or a substrate processing method including: (a) loading a substrate into a process container; (b) supplying a process gas (a source gas and a reactive gas) to the substrate in the process container to process the substrate; (c) (directly) supplying an inert gas to an inner wall of an opening of the process container at a first flow rate while performing the step (b); (d) unloading the substrate from the process container; and (e) (directly) supplying the inert gas to the inner wall of the opening of the process container at a second flow rate higher than the first flow rate while performing the step (a), the step (d) or the steps (a) and (d).

Supplementary Note 17

According to still another aspect of the present invention, there is provided a substrate processing apparatus including: a process container configured to accommodate a substrate; a source gas supply system configured to supply a source gas to the substrate in the process container; a reactive gas supply system configured to supply a reactive gas to the substrate in the process container; an inert gas supply system configured to supply a source gas to an inner wall of an opening of the process container; and a control unit configured to control the source gas supply system, the reactive gas supply system and the inert gas supply system to: (a) supply the source gas to the substrate in the process container; and (b) supplying the reactive gas to the substrate in the process container while supplying the inert gas to the inner wall of the opening of the process container at the first flow rate when performing the step (a), and supplying the inert gas to the inner wall of the opening of the process container at a second flow rate lower than the first flow rate when performing the step (b).

Supplementary Note 18

According to still another aspect of the present invention, there is provided a program or a non-transitory computer-readable recording medium storing a program for causing a computer to control a substrate processing apparatus to perform: (a) supplying a source gas to a substrate in a process container; (b) supplying an inert gas to an inner wall of an opening of the process container at a first flow rate while performing the step (a); (c) supplying a reactive gas to the substrate; and (d) supplying the inert gas to the inner wall of the opening of the process container at a second flow rate lower than the first flow rate while performing the step (c).

What is claimed is:

1. A method of manufacturing a semiconductor device, comprising:
   (a) supplying a source gas to a substrate in a process container through a first nozzle disposed at a side of a substrate arrangement region in the process container where the substrate is arranged;
   (b) supplying an inert gas to an inner wall of a portion of the process container about a lower end opening thereof at a first flow rate through a second nozzle disposed at the portion of the process container about the lower end opening thereof while performing (a);
   (c) supplying a reactive gas to the substrate through a third nozzle disposed at the side of the substrate arrangement region in the process container; and
   (d) supplying the inert gas to the inner wall at a second flow rate lower than the first flow rate through the second nozzle while performing (c).

2. The method of claim 1, wherein the inert gas is supplied to a purge space provided between the inner wall and a cover covering the inner wall in the (b) and (d).

3. The method of claim 1, wherein the inert gas is supplied to the inner wall from a direction facing the inner wall in the (b) and (d).

4. The method of claim 1, further comprising:
   (e) loading the substrate into the process container;
   (f) unloading the substrate from the process container; and
   (g) supplying the inert gas to the inner wall through the second nozzle at a third flow rate higher than the first flow rate and the second flow rate while performing (e), (f) or (e) and (f).

5. The method of claim 1, further comprising:
   (h) loading the substrate into the process container;
   (i) unloading the substrate from the process container; and (j) supplying the inert gas to the inner wall through the second nozzle at a third flow rate higher than the first flow rate while performing (h), (i) or (h) and (i).

6. The method of claim 1, wherein the process container comprises a reaction tube and a manifold supporting the reaction tube, and the inert gas is further supplied to an inner wall of the manifold.

7. The method of claim 6, wherein the portion of the process container about the lower end opening thereof is disposed at the manifold.

8. The method of claim 7, wherein the manifold comprises a metal member.

9. The method of claim 1, wherein the source gas comprises a predetermined element and a halogen element.

10. The method of claim 9, wherein the predetermined element comprises a metal element or a semiconductor element selected from a group consisting of silicon and germanium.

11. The method of claim 9, wherein the reactive gas comprises an oxygen-containing gas.

12. The method of claim 11, wherein the reactive gas further comprises a hydrogen-containing gas.

13. The method of claim 1, further comprising: (k) supplying the reactive gas to the inner wall while performing (c).

14. A method of manufacturing a semiconductor device, comprising:
(a) supplying a source gas to a substrate in a process container through a first nozzle disposed at a side of a substrate arrangement region in the process container where the substrate is arranged;
(b) supplying an inert gas to an inner wall of a portion of the process container about a lower end opening thereof through a second nozzle disposed at the portion of the process container about the lower end opening thereof while performing (a); and
(c) supplying a reactive gas to the substrate through a third nozzle disposed at the side of the substrate arrangement region in the process container,
wherein a supply of the inert gas to the inner wall is stopped through the second nozzle while performing (c).

15. The method of claim 2, wherein the inert gas is distributed from an inside of the purge space to an outside of the purge space through a gas distribution slit provided between a seal cap closing the lower end opening and the cover in (b).

16. The method of claim 1, wherein the second nozzle comprises a ring nozzle disposed along the inner wall and provided with a plurality of gas supply holes at an outer surface thereof, and the inert gas is supplied to the inner wall through the plurality of the gas supply holes in (b) and (d).

17. The method of claim 16, wherein the inert gas is further supplied from the plurality of the gas supply holes in a horizontal direction toward the inner wall in (b) and (d).

18. The method of claim 16, wherein the inert gas is further supplied from the plurality of the gas supply holes in a diagonally upward direction toward the inner wall in (b) and (d).

* * * * *